(12) United States Patent
Ahn et al.

(10) Patent No.: US 10,355,241 B2
(45) Date of Patent: Jul. 16, 2019

(54) METHOD OF MANUFACTURING A DISPLAY APPARATUS INCLUDING A BENDING AREA

(71) Applicant: SAMSUNG DISPLAY CO., LTD., Yongin-si, Gyeonggi-Do (KR)

(72) Inventors: Jooseob Ahn, Yongin-si (KR); Seongchae Jeong, Yongin-si (KR); Inae Han, Yongin-si (KR); Hyojin Kim, Yongin-si (KR); Jekil Ryu, Yongin-si (KR); Jaeseok Park, Yongin-si (KR); Gyoowan Han, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/815,098

(22) Filed: Nov. 16, 2017

(65) Prior Publication Data
US 2018/0175323 A1 Jun. 21, 2018

(30) Foreign Application Priority Data
Dec. 16, 2016 (KR) .......................... 10-2016-0172885

(51) Int. Cl.
*H01L 51/50* (2006.01)
*H01L 51/52* (2006.01)
(Continued)

(52) U.S. Cl.
CPC ...... *H01L 51/5253* (2013.01); *H01L 51/0097* (2013.01); *H01L 51/5246* (2013.01);
(Continued)

(58) Field of Classification Search
CPC ......... H01L 21/02345; H01L 21/02348; H01L 21/0275; H01L 21/707; H01L 21/78;
(Continued)

(56) References Cited

U.S. PATENT DOCUMENTS

| | | | | | |
|---|---|---|---|---|---|
| 4,931,134 | A | * | 6/1990 | Hatkevitz | ............ H05K 3/0035 156/150 |
| 5,419,038 | A | * | 5/1995 | Wang | ................... H05K 3/4691 174/254 |

(Continued)

FOREIGN PATENT DOCUMENTS

| | | |
|---|---|---|
| KR | 10-2014-0065547 | 5/2014 |
| KR | 10-2014-0085956 | 7/2014 |

(Continued)

*Primary Examiner* — Scott B Geyer
(74) *Attorney, Agent, or Firm* — F. Chau & Associates, LLC

(57) ABSTRACT

A method of manufacturing a display apparatus includes forming a plurality of display units including bending areas on a mother substrate. Each of the plurality of display units include a bending area configured to be bent about a bending axis. A protection film is attached to a lower surface of the mother substrate. The protection film includes a protection film base and an adhesive layer. An opening or a groove is formed corresponding to the bending area of each of the plurality of display units by removing at least a portion of the protection film. The mother substrate and the protection film are cut to separate the plurality of display units from each other. The mother substrate is bent about the bending axis. The removing of the at least a portion of the protection film is performed by a laser beam.

17 Claims, 16 Drawing Sheets

(51) Int. Cl.
*H01L 51/56* (2006.01)
*H01L 51/00* (2006.01)

(52) U.S. Cl.
CPC ........ *H01L 51/56* (2013.01); *H01L 2227/323* (2013.01); *H01L 2251/5338* (2013.01); *Y02E 10/549* (2013.01)

(58) Field of Classification Search
CPC ... H01L 21/782; H01L 49/02; H01L 33/0095; H01L 51/0097; H01L 51/0017; H01L 51/0018; H01L 51/009; H01L 51/5246; H01L 51/56; H01L 2227/323; H01L 2251/5338; H01L 2251/56; H01L 2251/566; H01L 2251/105; H05K 3/0026; H05K 3/0029; H05K 3/0032; H05K 3/22; H05K 3/28; H05K 3/4691; H05K 3/4688; H05K 3/4694
See application file for complete search history.

(56) References Cited

U.S. PATENT DOCUMENTS

| | | | | |
|---|---|---|---|---|
| 5,428,190 A * | 6/1995 | Stopperan | | H05K 3/323 174/250 |
| 5,434,362 A * | 7/1995 | Klosowiak | | H05K 1/028 174/254 |
| 5,854,534 A * | 12/1998 | Beilin | | H01L 21/486 257/691 |
| 6,359,236 B1 * | 3/2002 | DiStefano | | H01L 23/3107 174/250 |
| 6,762,942 B1 * | 7/2004 | Smith | | H05K 1/189 174/258 |
| 6,927,344 B1 * | 8/2005 | Gall | | H05K 1/0278 174/254 |
| 7,545,649 B2 * | 6/2009 | Tan | | H05K 1/028 174/254 |
| 7,875,969 B2 * | 1/2011 | Su | | H05K 3/4691 174/254 |
| 8,359,738 B2 * | 1/2013 | Takahashi | | H05K 3/4691 174/254 |
| 8,500,938 B2 * | 8/2013 | Stahr | | H05K 3/4691 156/256 |
| 8,882,954 B2 * | 11/2014 | Lee | | H05K 3/4644 156/247 |
| 9,048,443 B2 | 6/2015 | Namkung et al. | | |
| 9,253,898 B2 * | 2/2016 | Chen | | H05K 3/4644 |
| 9,419,065 B2 | 8/2016 | Degner et al. | | |
| 9,544,994 B2 * | 1/2017 | Kwon | | H05K 1/028 |
| 2002/0170827 A1 * | 11/2002 | Furuya | | C25D 5/00 205/131 |
| 2004/0118595 A1 * | 6/2004 | Flammer | | H05K 1/0278 174/254 |
| 2007/0059918 A1 * | 3/2007 | Jung | | H05K 1/189 438/618 |
| 2007/0141348 A1 * | 6/2007 | Witzmann | | C03B 5/43 428/409 |
| 2009/0283301 A1 * | 11/2009 | Takahashi | | H05K 3/4691 174/254 |
| 2010/0139967 A1 * | 6/2010 | Takahashi | | H05K 1/142 174/262 |
| 2014/0184057 A1 | 7/2014 | Kim et al. | | |
| 2016/0195753 A1 | 7/2016 | Yeo | | |
| 2017/0062773 A1 | 3/2017 | Lee et al. | | |
| 2017/0082851 A1 | 3/2017 | Han et al. | | |
| 2017/0179423 A1 * | 6/2017 | Kwon | | H01L 27/323 |
| 2017/0263887 A1 * | 9/2017 | Han | | H01L 27/3276 |
| 2017/0271616 A1 * | 9/2017 | Choi | | H01L 51/5253 |
| 2017/0278901 A1 * | 9/2017 | Kim | | H01L 51/0097 |
| 2017/0287936 A1 * | 10/2017 | Kim | | H01L 27/124 |
| 2017/0288007 A1 * | 10/2017 | Shin | | H01L 51/56 |
| 2017/0317299 A1 * | 11/2017 | Choi | | H01L 27/3262 |
| 2017/0323779 A1 * | 11/2017 | Um | | G02F 1/133711 |
| 2017/0359899 A1 * | 12/2017 | Heo | | H05K 3/0026 |
| 2018/0019418 A1 * | 1/2018 | Sonoda | | H01L 27/3276 |
| 2018/0090702 A1 * | 3/2018 | Um | | H01L 51/56 |

FOREIGN PATENT DOCUMENTS

| | | |
|---|---|---|
| KR | 10-1417924 | 7/2014 |
| KR | 10-2014-0105414 | 9/2014 |
| KR | 10-2015-0007632 | 1/2015 |
| KR | 10-2015-0036443 | 4/2015 |
| KR | 10-2015-0080325 | 7/2015 |
| KR | 10-2015-0102072 | 9/2015 |
| KR | 10-2015-0102180 | 9/2015 |
| KR | 10-2016-0084129 | 7/2016 |
| KR | 10-2016-0085393 | 7/2016 |
| KR | 10-2016-0087056 | 7/2016 |
| KR | 10-2015-0121340 | 10/2018 |

* cited by examiner

FIG. 4

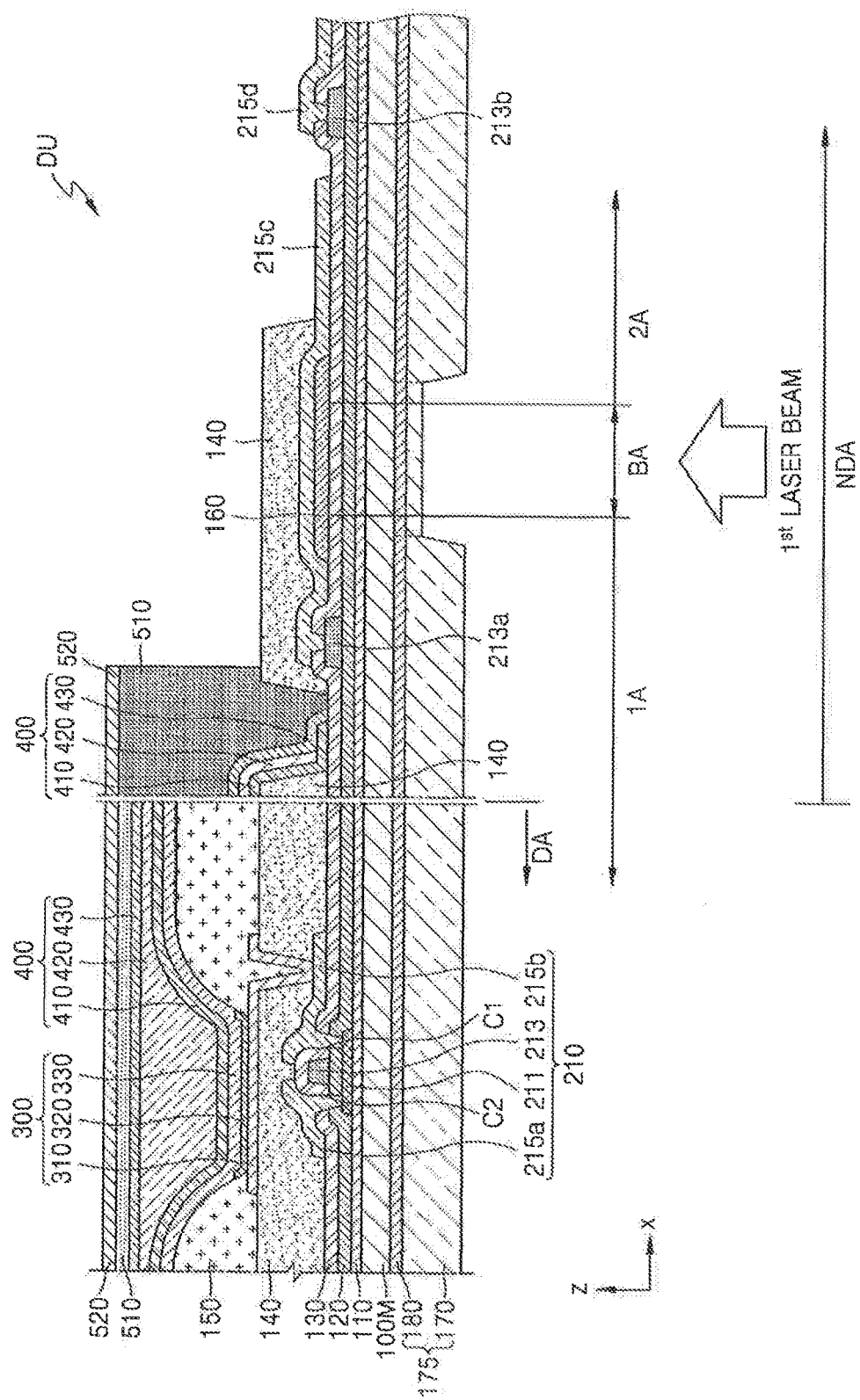

METHOD OF MANUFACTURING A DISPLAY APPARATUS INCLUDING A BENDING AREA

CROSS-REFERENCE TO RELATED APPLICATION

This application claims the benefit of Korean Patent Application No. 10-2016-0172885, filed on Dec. 16, 2016 in the Korean Intellectual Property Office, the disclosure of which is incorporated by reference herein in its entirety.

TECHNICAL FIELD

Exemplary embodiments of the present invention relate to a method of manufacturing a display apparatus, and more particularly to a method of manufacturing a display apparatus including a bending area.

DISCUSSION OF RELATED ART

A display apparatus visually displays data. The display apparatus includes a substrate. The substrate is divided into a display area and a non-display area. In the display area, a plurality of gate lines and plurality of data lines are formed. The gate lines and the data lines are insulated from each other. The gate lines and the data lines intersect each other to define a plurality of pixel areas in the display area. Furthermore, a plurality of thin-film transistors and a plurality of pixel electrodes are provided in the display area in correspondence to the respective pixel areas. The pixel electrodes are electrically connected to the thin-film transistors. The non-display area includes various conductive layers. For example, the non-display area may include a wire configured to transmit an electric signal to the display area.

At least a portion of the display apparatus may be bent, for example, to increase a visibility at various angles to a user or reduce an area of the non-display area. A method of minimizing defects of manufacturing a bendable display apparatus and reducing the cost of the same may be provided.

SUMMARY

One or more exemplary embodiments of the present invention provides a method of manufacturing a display apparatus, and more particularly, a method of manufacturing a display apparatus including a bending area, in which defects, process time, and costs incurred during the manufacturing process are reduced.

One or more exemplary embodiments of the present invention provide a method of manufacturing a display apparatus. The method includes forming a plurality of display units on a mother substrate. Each of plurality of display units includes a bending area. The bending areas are configured to be bent about a bending axis. A protection film is attached to a lower surface of the mother substrate. The protective film includes a protection film base and an adhesive layer. An opening or a groove is formed corresponding to the bending areas of each of the plurality of display units. The opening or a groove is formed by removing at least a portion of the protection film. The mother substrate and the protection film are cut to separate the plurality of display units from each other. The mother substrate is bent about the bending axis. The removing of the at least a portion of the protection film is performed by a laser beam.

The removing of the at least a portion of the protection film may include removing at least a portion of the protection film base.

The removing of the at least a portion of the protection film may include removing at least portions of the protection film base and at least a portion of the adhesive layer.

The laser beam may have a top-hat waveform.

The laser beam may be formed as a laser beam from a laser light source passing through an optical system including at least one of a beam shaper, a diffractive optical elements (DOE) lens, and a slit.

In the using of the laser beam to remove the at least a portion of the adhesive layer, a first laser beam and a second laser beam may be used.

An intensity of the first laser beam may be higher than an intensity of the second laser beam.

The laser beam may be generated by a $CO_2$ laser.

The method may further include, before the removing of the at least a portion of the protection film, weakening an adhesiveness of the adhesive layer by using an ultraviolet (UV) ray to a portion of the protection film in which the opening or the groove is to be formed.

A plurality of openings or grooves may be formed in the protection film in correspondence to the bending area. An area of each of the plurality of openings or grooves may be smaller than an area of the bending area.

An area of the opening or the groove of the protection film may be greater than an area of the bending area.

Each of the display unit may be disposed on a substrate in which the bending area is between a first area and a second area and include an inorganic insulation layer; a conductive layer; and an organic material layer. The inorganic insulation layer may be disposed on the substrate. The conductive layer may be disposed on the inorganic insulation layer and overlapping the first area, the bending area, and the second area. The organic material layer may be disposed between the inorganic insulation layer and overlapping the bending area.

A portion of the inorganic insulation layer overlapping the organic material layer may have a substantially flat upper surface.

The portion of the inorganic insulation layer overlapping the organic material layer may have a groove or an opening. The organic material layer may fill at least a portion of the groove or the opening of the inorganic insulation layer.

The method may further include disposing a cushion layer between the first area and the second area after each of the display units is bent.

One or more exemplary embodiments of the present invention provides a method of manufacturing a display apparatus. The method includes forming a display unit on a substrate. The display unit includes a bending area disposed between a first area and a second area. A protection film is disposed on a lower surface of the substrate. At least a portion of the protection film is removed to form an opening or a groove corresponding to the bending area. The opening or groove is disposed in portions of each of the first area and the second area.

The removing of the at least a portion of the protection film may be performed by a laser beam.

The laser beam may have a wavelength in a range of from about 9 μm to about 10 μm.

One or more exemplary embodiments of the present invention provides a method of manufacturing a display apparatus. The method includes forming a plurality of display units on a substrate. Each of plurality of display units includes a bending area. An adhesive layer is disposed on a lower surface of the substrate. A protection film is disposed on a lower surface of the adhesive layer. An opening or a groove is formed by removing at least a portion of the protection film base. The plurality of display units are separated from each other to provide singular display units each disposed on a separate substrate. The substrate is bent at the bending area about a bending axis. The opening or the groove corresponds to the bending areas.

The removing of the at least a portion of the protection film base may be performed by a laser beam.

BRIEF DESCRIPTION OF THE DRAWINGS

These and/or other aspects will become apparent and more readily appreciated from the following description of the exemplary embodiments, taken in conjunction with the accompanying drawings, in which:

FIGS. 2, 3A, 3B, and 4 to 9 are diagrams illustrating a method of manufacturing a display apparatus of FIG. 1 according to an exemplary embodiment of the present invention;

FIGS. 11A and 11B are diagrams illustrating a method of forming an opening or a groove of a protection film according to an exemplary embodiment of the present invention;

DETAILED DESCRIPTION OF THE EMBODIMENTS

Figure 1:
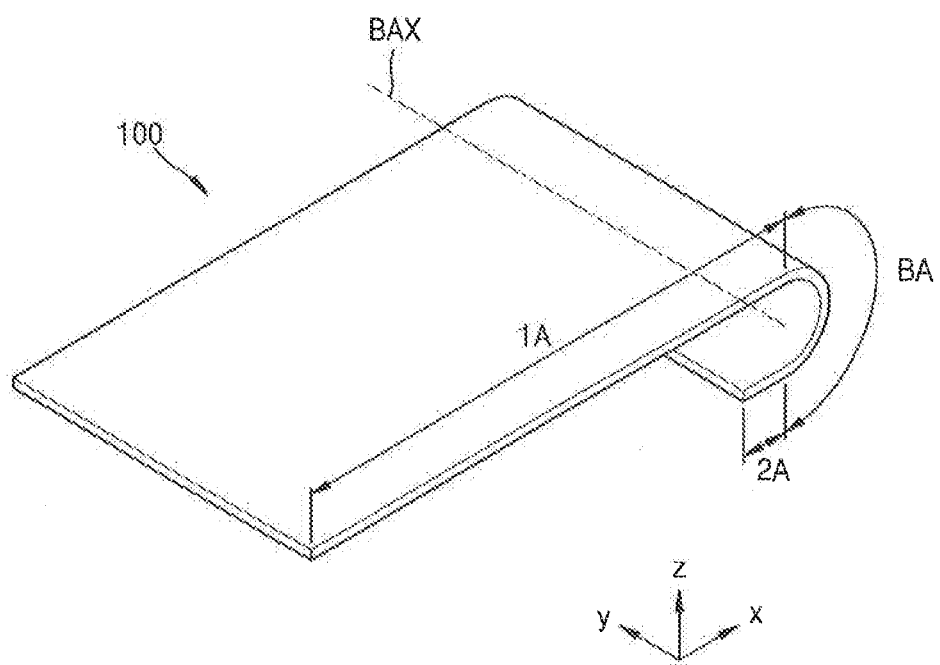
FIG. 1 is a perspective view illustrating a portion of a display apparatus according to an exemplary embodiment of the present invention.

Reference will now be made in detail to exemplary embodiments of the present invention, examples of which are illustrated in the accompanying drawings, wherein like reference numerals refer to like elements throughout. In this regard, the present exemplary embodiments of the present invention may have different forms and should not be construed as being limited to the descriptions set forth herein. Therefore, the exemplary embodiments of the present invention are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that although the terms "first", "second", etc. may be used herein to describe various components, these components should not be limited by these terms. These components are only used to distinguish one component from another.

It will be understood that when a layer, region, or component is referred to as being "formed on" another layer, region, or component, it can be directly or indirectly formed on the other layer, region, or component. That is, for example, intervening layers, regions, or components may be present.

In the following examples, the x-axis, the y-axis and the z-axis are not limited to three axes of the rectangular coordinate system, and may be interpreted in a broader sense. For example, the x-axis, the y-axis, and the z-axis may be substantially perpendicular to one another, or may represent different directions that are not perpendicular to one another.

When a certain exemplary embodiment of the present invention may be implemented differently, a specific process order may be performed differently from the described order. For example, two consecutively described processes may be performed substantially at the same time or performed in an order opposite to the described order.

A display apparatus may display an image, and examples thereof may be a liquid crystal display, an electrophoretic display, an organic light-emitting display, an inorganic light-emitting display, a field emission display, a surface-conduction electron-emitter display, a plasma display, or a cathode ray display; however, exemplary embodiments of the present invention are not limited thereto.

Hereinafter, a display apparatus according to an exemplary embodiment of the present invention will be described in more detail with reference to an organic light-emitting display; however, the display apparatus according to exemplary embodiments of the present invention is not limited thereto and the display apparatus may be other types of display apparatuses.

Figure 2:
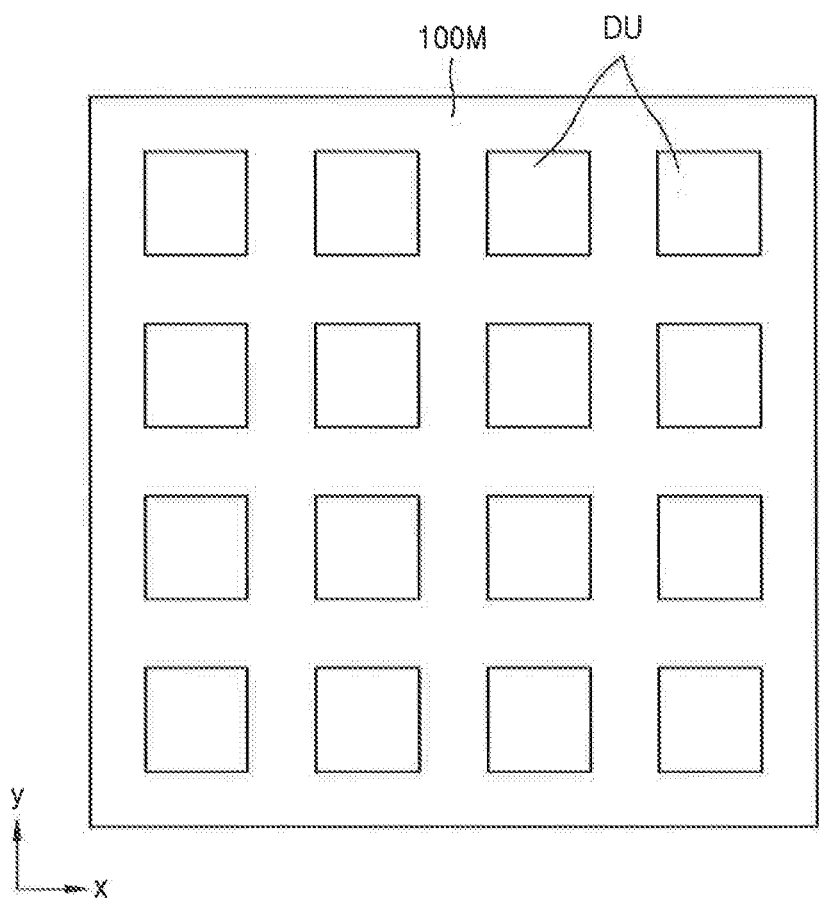

FIG. 1 is a schematic perspective view illustrating a portion of a display apparatus according to an exemplary embodiment of the present invention. Referring to FIG. 1, a display apparatus may include a substrate 100. As a portion of the substrate 100 is bent, the display apparatus may also have a shape in which a portion of the display apparatus is bent corresponds to the substrate 100. Referring to FIG. 2, at least one display unit DU may be disposed over the substrate 100 as described in more detail below. For example, a plurality of display units DU may be disposed over the substrate 100.

Referring to FIG. 1, the substrate 100 included in the display apparatus may have a bending area BA. The substrate 100 included in the display apparatus may also have a first area 1A and a second area 2A. The bending area BA may extend in a first direction (e.g., a +y direction). The bending area BA may be positioned between the first area 1A and the second area 2A, for example, in a second direction (e.g., a +x direction); however, exemplary embodiments of the present invention are not limited thereto. The second direction may intersect the first direction. Referring to FIG. 1, the substrate 100 may be bent around a bending axis BAX. The bending axis BAX may extend in the first direction (e.g., the +y direction). The substrate 100 may include various materials having flexible or bendable characteristics. For example, the substrate 100 may include a polymer resin, such as polyethersulfone (PES), polyacrylate (PAR), polyetherimide (PEI), polyethylene (PEN), polyethylene terephthalate (PET), polyphenylene sulfide (PPS), polyallylate, polyimide (PI), polycarbonate (PC), or cellulose acetate propionate (CAP). The substrate 100 may have a single layered structure or a multi-layered structure. According to some exemplary embodiments of the present invention, the substrate 100 may have a multi-layered structure including a resin layer and a barrier layer. The resin layer and the barrier layer may be alternately stacked with each other. The resin layer may include a resin. The barrier layer may include an inorganic material, such as silicon oxide or silicon nitride. Furthermore, the substrate 100 may include an intermediate layer. The intermediate layer may be disposed between the resin layer and the barrier layer. The intermediate layer may include amorphous silicon (a-Si). The structure of the substrate 100 is not limited thereto, and various modifications may be made to the structure thereof.

FIGS. 2, 3A, 3B and 4 to 9 are diagrams illustrating a method of manufacturing a display apparatus of FIG. 1 according to an exemplary embodiment of the present invention.

Referring to FIG. 2, a plurality of display units DU may be formed on a mother substrate 100M. For example, the plurality of display units DU may be formed on an upper surface of the mother substrate 100M. The plurality of display unites DU may be spaced apart from each other. The plurality of display units DU may be formed on the mother substrate 100M in a grid pattern; however, exemplary embodiments of the present invention are not limited thereto. Several operations may be performed before formation of the plurality of display units DU. For example, a buffer layer may be disposed on at least a portion the mother substrate 100M, for example, on an upper surface of the mother substrate 100M. The buffer layer may be disposed on an entirety of the mother substrate 100M. Furthermore, when the plurality of display units DU are formed, electronic elements, such as a plurality of thin-film transistors, may be disposed in a display area of the display apparatus in addition to display elements. The electronic elements, such as the plurality of thin-film transistors, may be electrically connected to the display units DU. The electronic elements may also be disposed in the peripheral area of the display apparatus. The peripheral area may be positioned outside the display area. When the plurality of display units DU are formed, an encapsulation layer may be disposed on the mother substrate 100M. The encapsulation layer may protect the display elements included in the display area of the display apparatus. A detailed configuration of the display unit DU will be described in more detail below. When the plurality of display units DU are disposed, the plurality of display units DU may be disposed on the mother substrate 100M by a carrier substrate. The carrier substrate may include a relatively thick glass. A hardness of the carrier substrate may reduce or prevent the mother substrate 100M, which may include a flexible or bendable material, from being bent or deformed during a manufacturing process of the display apparatus. After the plurality of display units DU are disposed on the mother substrate 100M, the mother substrate 100M may be separated from the carrier substrate.

Figure 3A:
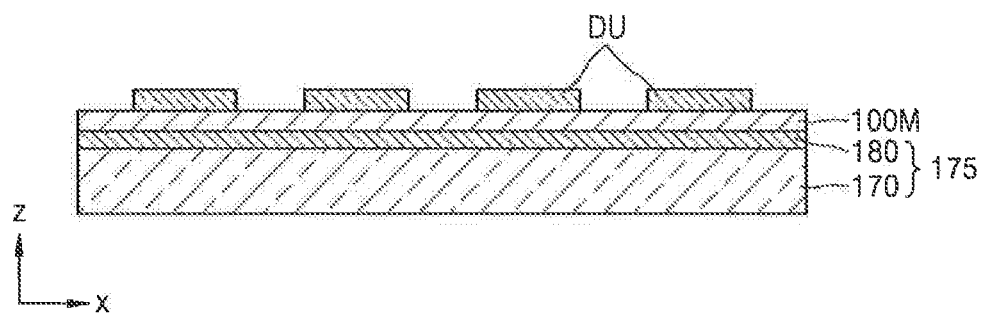

Referring to FIG. 3A, a protection film 175 may be disposed on the mother substrate 100M. For example, the protection film 175 may be disposed on a lower surface of the mother substrate 100M. The lower surface of the mother substrate 100M may refer to a surface located in a direction (e.g., a −z direction) opposite to a direction (e.g., a +z direction) in which a display of the display apparatus is to be located. The protection film 175 may protect the lower surface of the mother substrate 100M. The protection film 175 may include a protection film base 170 and an adhesive layer 180. The adhesive layer 180 may be disposed between the mother substrate 100M and the protection film base 170. The protection film 175 may be attached to the mother substrate 100M, for example, by applying a pressure to the lower surface of the protection film 175 in a direction (e.g., a +z direction) toward the upper surface of the substrate 100. The pressure may be applied, for example, by using a roller.

Figure 3B:
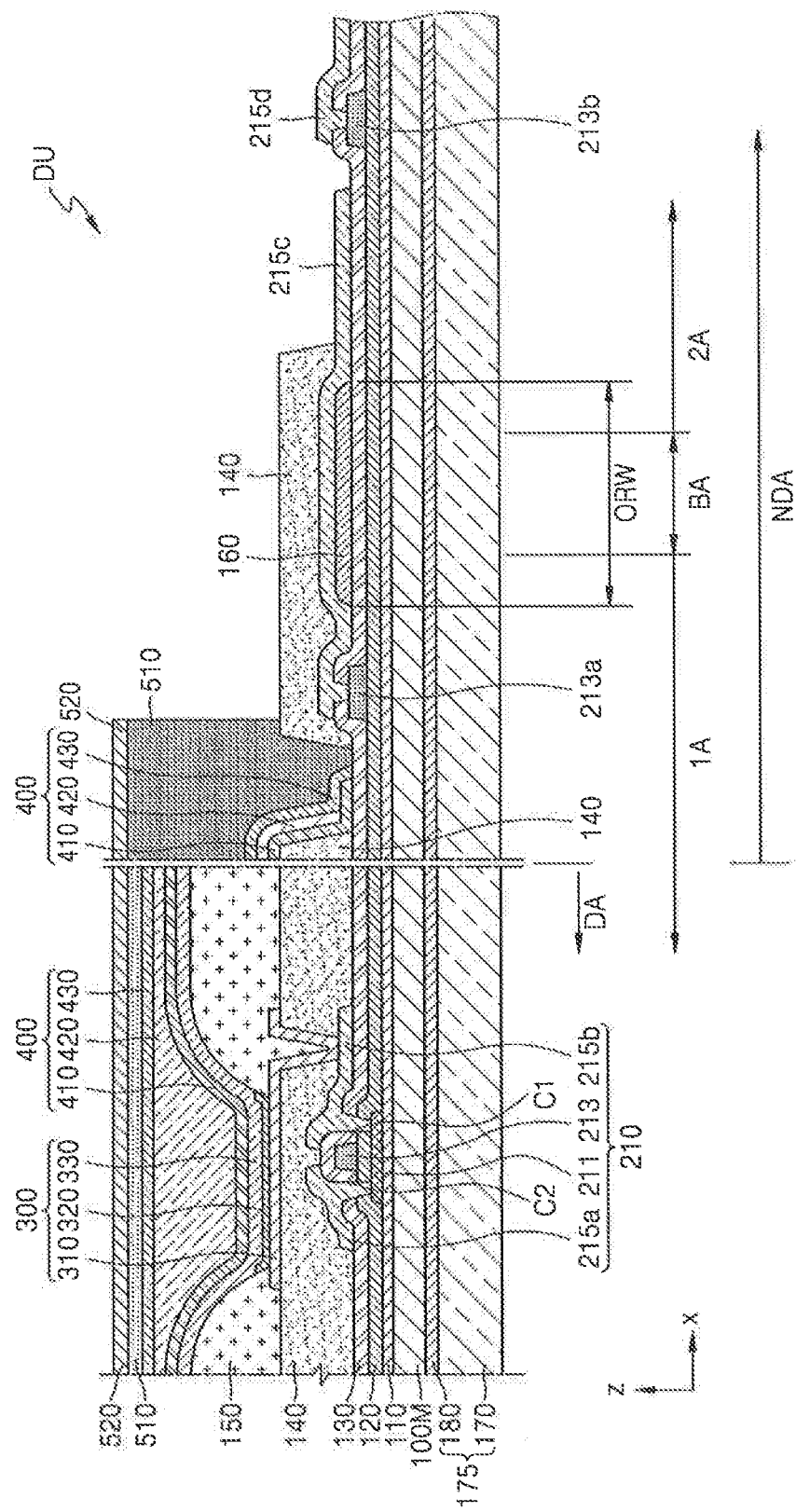

FIG. 3B is a cross-sectional view illustrating a portion of a display unit DU formed on the mother substrate 100M according to an exemplary embodiment of the present invention.

The first area 1A of the display unit DU may include a display area DA. The first area 1A may also include a portion of a non-display area NDA. The non-display area NDA may be positioned outside the display area DA. The second area 2A may include the non-display area NDA. A display may be disposed in the first area 1A. The display may include at least one display element, for example, an organic light-emitting device 300 or a thin-film transistor (TFT) 210. The display may include components disposed within the display area DA. Alternatively, the display may also include components that belong to the first area 1A and are disposed in the non-display area NDA. The display unit DU may have the bending area BA disposed between the first area 1A and the second area 2A. Referring to FIG. 1, the display unit DU may be bent at the bending area BA into a structure corresponding to the substrate 100 as illustrated in FIG. 1.

A plurality of pixels may be arranged in the display area DA of the display unit DU, for example, to display an image. In the display area DA, elements including a display element, such as the organic light-emitting device 300, a TFT 210, and a capacitor may be disposed. The display area DA may further include signal wires, such as a gate line, a data line, a driving power line, and a common power line. The gate line may transmit a gate signal. The data line may transmit a data signal. The driving power line may transmit power. A pixel may be formed, for example, by an electrical combination of the TFT 210, the capacitor Cst, and a display element such as the organic light-emitting device 300 connected to each of the gate line, the date line, and the driving power line. Thus, an image may be displayed on the display. The pixel may emit light at a brightness corresponding to a driving current flowing through the organic light-emitting device 300. The pixel may emit light, for example, in correspondence to a data signal corresponding to a driving power and a common power supplied to the pixel. A plurality of pixels may be arranged in the display area DA of the display unit DU. The plurality of pixels may be arranged in various shapes, e.g., a stripe arrangement or a pentile arrangement; however, exemplary embodiments of the present invention are not limited thereto.

Since the organic light-emitting device 300 may be electrically connected to the TFT 210, a pixel electrode 310 may be electrically connected to the TFT 210. A TFT may be disposed in the peripheral area outside the display area DA. A TFT in the peripheral area may be, for example, a portion of a circuit for controlling electric signals applied to the display area DA.

The TFT 210 may include a semiconductor layer 211, a gate electrode 213, a source electrode 215a, and a drain electrode 215b. The semiconductor layer 211, the gate electrode 213, the source electrode 215a, and the drain electrode 215b may each include amorphous silicon, polycrystalline silicon, an oxide semiconductor, or an organic semiconductor material.

The gate electrode 213 may be connected to a gate wire, for example, for applying an ON/OFF signal to the TFT 210. The gate electrode 213 may include a metal, e.g., a relatively low-resistance metal. For example, the gate electrode 213 may be a single film or a multi-layered film including a conductive material. The conductive material may include molybdenum (Mo), aluminum (Al), copper (Cu), and/or titanium (Ti).

The source electrode 215a and the drain electrode 215b may be single films or multi-layered films including a conductive material. The conductive material may have a relatively high conductivity. The source electrode 215a and the drain electrode 215b may be respectively connected to a source region and a drain region of the semiconductor layer 211. For example, the source electrode 215a and the drain electrode 215b may be single films or multilayered films including a conductive material including aluminum (Al), copper (Cu), and/or titanium (Ti)

The source electrode 215a and the drain electrode 215b may be connected to the semiconductor layer 211, for example, through contact holes C1 and C2, respectively. The contact holes C1 and C2 may be formed by etching an interlayer insulation film 130 and a gate insulation film 120 at substantially the same time.

According to an exemplary embodiment of the present invention, the TFT 210 may be a top-gate type transistor in which the gate electrode 213 is disposed above the semiconductor layer 211; however, exemplary embodiments of the present invention are not limited thereto. For example, the TFT 210 may be a bottom-gate type electrode in which the gate electrode 213 is disposed below the semiconductor layer 211.

The gate insulation film 120 may be disposed between the semiconductor layer 211 and the gate electrode 213. The gate insulation film 120 may insulate the semiconductor layer 211 and the gate electrode 213 from each other. The gate insulation film 120 may include an inorganic material, such as silicon oxide, silicon nitride, and/or silicon oxynitride. Furthermore, the interlayer insulation film 130 may be disposed on the gate electrode 213. The interlayer insulation film 130 may include an inorganic material, such as silicon oxide, silicon nitride, and/or silicon oxynitride. The source electrode 215a and the drain electrode 215b may be disposed on the interlayer insulation film 130. An insulating film including an inorganic material such as the interlayer insulation film 130 may be disposed, for example, through a deposition method such as chemical vapor deposition (CVD) or atomic layer deposition (ALD). The same also applies to exemplary embodiments of the present invention described in more detail below and modifications thereof.

A buffer layer 110 may be disposed between the TFT 210. The buffer layer 110 may have a structure corresponding to a structure of the mother substrate 100M. The buffer layer 110 may have a single-layered structure or a multi-layered structure. The buffer layer 110 may increase a planarity of the upper surface of the substrate 100. The buffer layer 110 may also reduce or prevent impurities from the substrate 100 from permeating into the semiconductor layer 211 of the TFT 210. The semiconductor layer 211 may be disposed on the buffer layer 110.

A planarizing layer 140 may be disposed on the TFT 210. For example, referring to FIG. 3B, when the organic light-emitting device 300 is disposed on the TFT 210, the planarizing layer 140 may substantially planarize an upper surface of a protection layer covering at least a portion of the TFT 210. The planarizing layer 140 may include an organic material, such as acryl, benzocyclobutene (BCB), or hex- amethyldisiloxane (HMDSO). The planarizing layer 140 may be a single layer; however, various modifications may be made thereto. For example, the planarizing layer 140 may have a multi-layered structure. Referring to FIG. 3B, the planarizing layer 140 may have openings. The openings may be positioned outside the display area DA. The openings may be positioned in the non-display area NDA. Thus, a portion of the planarizing layer 140 in the display area DA and a portion of the planarizing layer 140 in the second area 2A may be separated from each other. Accordingly, impurities from the outside may be reduced or prevented from permeating the interior of the display area DA through the interior of the planarizing layer 140. The planarizing layer 140 might not be disposed in the second area 2A of the display area DA.

In the display area DA, the organic light-emitting device 300 may be disposed on the planarizing layer 140. The organic light-emitting device 300 may include the pixel electrode 310, a counter electrode 330, and an intermediate layer 320. The intermediate layer 320 may be disposed between the counter electrode 330 and the pixel electrode 310. The intermediate layer 320 may include an emission layer. The pixel electrode 310 may be electrically connected to the TFT 210, for example, by contacting the source electrode 215a or the drain electrode 215b through the openings formed in the planarizing layer 140.

A pixel-defining film 150 may be disposed on the planarizing layer 140. The pixel-defining film 150 may include a plurality of openings. The openings may correspond to respective sub-pixels. Thus, the openings may expose at least a central portion of the pixel electrode 310. Thus, the plurality of pixels may be defined. Furthermore, the pixel-defining film 150 may increase distances between the edges of the pixel electrode 310 and the counter electrode 330 disposed above the pixel electrode 310. Thus, formation of an arc at the edges of the pixel electrode 310 may be reduced or prevented. The pixel-defining film 150 may include an organic material, such as polyimide (PI) or hexamethyldisiloxane (HMDSO).

The intermediate layer 320 of the organic light-emitting device 300 may include a monomer material or a polymer material. When the intermediate layer 320 includes a monomer material, the intermediate layer 320 may have a structure in which a hole injection layer (HIL), a hole transport layer (HTL), an emission layer (EML), an electron transport layer (ETL), and an electron injection layer (EIL) are stacked as a single layer or a composite structure. The intermediate layer 320 may include various organic materials, such as copper phthalocyanine (CuPc), N,N-di(naphthalen-1-yl)-N,N'-diphenyl-benzidine (NPB), or tris-8-hydroxyquinoline aluminum (Alq3). The hole injection layer (HIL), the hole transport layer (HTL), the emission layer (EML), the electron transport layer (ETL), and the electron injection layer (EIL) may be formed, for example, by vacuum deposition.

When the intermediate layer 320 includes a polymer material, the intermediate layer 320 may have a structure including the hole transport layer (HTL) and the emission layer (EML). The hole transport layer (HTL) may include PEDOT. The emission layer (EML) may include a polymer material, such as a poly-phenylenevinylene (PPV) polymer or a polyfluorene polymer. The intermediate layer 320 may be disposed, for example, using a screen printing method, an inkjet printing method, or a laser induced thermal imaging (LITI) method; however, exemplary embodiments of the present invention are not limited thereto.

The intermediate layer 320 is not limited thereto and may have various other structures. For example, the intermediate layer 320 may include an integrated layer corresponding to a plurality of pixel electrodes 310. Alternatively, the intermediate layer 320 may include a layer patterned corresponding to the plurality of pixel electrodes 310.

The counter electrode 330 may be disposed over the display area DA. For example, the counter electrode 330 may be disposed to at least partially cover the display area DA. Referring to FIG. 3B, the counter electrode 330 may be disposed to cover an entirety of the display area DA. Thus, the counter electrode 330 may be integrally formed with respect to a plurality of organic light-emitting devices 300. Furthermore, the counter electrode 330 may correspond to the plurality of pixel electrodes 310.

An encapsulation layer 400 may be disposed to at least partially cover the display area DA. The encapsulation layer 400 may also extend out of the display area DA. For example, referring to FIG. 3B, the encapsulation layer 400 may be disposed in the non-display area NDA of the first area 1A. The encapsulation layer 400 may reduce or prevent impurities, such as moisture or oxygen, from penetrating into and damaging the organic light-emitting device. Referring to FIG. 3B, encapsulation layer 400 may include a first inorganic encapsulation layer 410, an organic encapsulation layer 420 and a second inorganic encapsulation layer 430. The organic encapsulation layer 420 may be disposed between the first inorganic encapsulation layer 410 and the second inorganic encapsulation layer 430.

The first inorganic encapsulation layer 410 may at least partially cover the counter electrode 330. Referring to FIG. 3B, the first inorganic encapsulation layer 410 may cover an entirety of an upper surface of the counter electrode 330. The first inorganic encapsulation layer 410 may include silicon oxide, silicon nitride, and/or silicon oxynitride. Other layers, such as a capping layer, may be disposed between the first inorganic encapsulation layer 410 and the counter electrode 330. Referring to FIG. 3B, since the first inorganic encapsulation layer 410 may be disposed along a structure therebelow, an upper surface of the first inorganic encapsulation layer 410 might not be substantially flat. The organic encapsulation layer 420 may cover at least a portion of the first inorganic encapsulation layer 410. Referring to FIG. 3B, the organic encapsulation layer 420 may cover an entirety of an upper surface of the inorganic encapsulation layer 410 in the display area DA. The upper surface of the organic encapsulation layer 420 may be substantially flat. For example, an upper surface of a portion of the organic encapsulation layer 420 corresponding to the display area DA may be substantially flat. The organic encapsulation layer 420 may include one or more materials including PET, polyethylene naphthalate, PC, PI, polyethylene sulfonate, polyoxymethylene, polyarylate, or hexamethyldisiloxane (HMDSO). The second inorganic encapsulation layer 430 may at least partially cover the organic encapsulation layer 420. For example, the second inorganic encapsulation layer 420 may cover an entirety of an upper surface of the organic encapsulation layer 420. The inorganic encapsulation layer 430 may include silicon oxide, silicon nitride, and/or silicon oxynitride. The second inorganic encapsulation layer 430 may contact the first inorganic encapsulation layer 410 outside the display area DA. Thus, exposure of the organic encapsulation layer 420 to the outside may be reduced or prevented. In the non-display area NDA of the first area 1A, the organic encapsulation layer 420 may be disposed at least partially between the first inorganic encapsulation layer 410 and the second inorganic encapsulation layer 430. Thus, the second inorganic encapsulation layer 430 may at least partially be disposed on the first inorganic layer 410 as illustrated in FIG. 3B.

As described above, the encapsulation layer 400 may include the first inorganic encapsulation layer 410, the organic encapsulation layer 420, and the second inorganic encapsulation layer 430. The multi-layered structure may reduce or prevent an occurrence of cracks in the encapsulation layer 400. However, when cracks occur in the encapsulation layer 400, such a multi-layered structure may reduce or prevent the cracks from being connected to each other between the first inorganic encapsulation layer 410 and the organic encapsulation layer 420 or between the organic encapsulation layer 420 and the second inorganic encapsulation layer 430. Thus, a formation of a pathway through which impurities such as moisture or oxygen from the outside may permeate into the display area DA may be reduced or prevented.

A polarizing plate 520 may be disposed on the encapsulation layer 400, for example, via an optically clear adhesive (OCA) 510. The polarizing plate 520 may reduce an external light reflection. For example, when an external light passes through the polarizing plate 520, the external light may be reflected at the upper surface of the counter electrode 330. The external light may pass through the polarizing plate 520 again. Thus, the polarizing plate 520 may change the phase of the external light. Accordingly, the phase of the reflected external light may be different from the phase of the external light entering the polarizing plate 520. Thus, a destructive interference may occur. Accordingly, external light reflection may be reduced and visibility may be increased. The OCA 510 and the polarizing plate 520 may cover at least a portion of the openings of the planarizing layer 140. For example, the OCA 510 and the polarizing plate 520 may cover the openings of the planarizing layer 410. A display apparatus according to the present exemplary embodiment of the present invention might not include the polarizing plate 520. The polarizing plate 520 may be replaced with other components, such as a black matrix and a color filter.

A touch electrode may be formed on the encapsulation layer 400. The touch electrode may have various patterns, for example, for touch screen functions. A touch protection layer may be formed on the touch electrode. The touch protection layer may protect the touch electrode.

The buffer layer 110, the gate insulation film 120, and the interlayer insulation film 130 may each include an inorganic material. The buffer layer 110, the gate insulation film 120, and the interlayer insulation film 130 may be collectively referred to as an inorganic insulation layer. Referring to FIG. 3B, the inorganic insulation layer may have a substantially flat upper surface in a region overlapping an organic material layer 160 as described in more detail below.

A first conductive layer 215c may be disposed over the inorganic insulation layer. The first conductive layer 215c may extend from the first area 1A to the second area 2A. The first conductive layer 215c may be configured to function as a wire, for example, that transmits an electric signal to the display area DA. The first conductive layer 215c may include substantially a same material as the source electrode 215b or the drain electrode 215b. The first conductive layer 215c may be disposed at substantially the same time as the source electrode 215a or the drain electrode 215b.

The organic material layer 160 may be disposed between the inorganic insulation layer and the first conductive layer 215c. The organic material layer 160 may be disposed to at least partially cover the bending area BA of the display unit DU. For example, referring to FIG. 3B, the organic material layer 160 may be disposed to cover an entirety of the bending area BA of the display unit DU. The organic material layer 160 may minimize a tensile stress transmitted to the first conductive layer 215c, for example, by buffering or absorbing the tensile stress applied to the substrate 100 and the inorganic insulation layer when the substrate 100 and the inorganic insulation layer are bent at the bending area BA.

The organic material layer 160 may be disposed to at least partially cover the bending area BA. The organic material layer 160 may at least partially extend to a portion of a non-bending area of the display unit DU, for example, the first area 1A and the second area 2A. Thus, the organic material layer 160 may be disposed on the inorganic insulation layer with a width ORW. The organic material layer 160 may be disposed to at least partially cover the bending area BA. For example, the organic material layer 160 may be disposed to overlap the bending area BA. The area occupied by the organic material layer 160 may be larger than the bending area BA. Thus, referring to FIG. 3B, the organic material layer 160 may have a greater length than a length of the bending area BA in a cross-sectional view. Referring to FIG. 3B, the width ORW of the organic material layer 160 may be greater than a width of the bending area BA. A thickness of a portion of the organic material layer 160 overlapping the bending area BA may be greater than a thickness of a portion of the organic material layer 160 not overlapping the bending area BA. The thickness of the portion of the organic material layer 160 overlapping the bending area BA may be determined considering, for example, a stress applied due to bending the display apparatus DA at the bending area BA. The organic material layer 160 may include PI, acryl, BCB, or hexamethyldisiloxane (HMDSO).

The display apparatus according to an exemplary embodiment of the present invention may include second conductive layers 213a and 213b in addition to the first conductive layer 215c. The display apparatus may also include a third conductive layer 215d. The third conductive layer 215d may be disposed on a same layer as the first conductive layer 215c. The second conductive layers 213a and 213b may be disposed in the first area 1A or the second area 2A. The second conductive layers 213a and 213b may also be disposed in the first area 1A and the second area 2A. The second conductive layers 213a and 213b may be disposed on a layer different from a layer on which the first conductive layer 215c is located. The second conductive layers 213a and 213b may be electrically connected to the first conductive layer 215c or the third conductive layer 215d. Referring to FIG. 3B, the second conductive layers 213a and 213b may include substantially a same material as the gate electrode 213 of the TFT 210. The second conductive layers 213a and 213b may be located on a same layer as the gate electrode 213 of the TFT 210. Thus, the second conductive layers 213a and 213b may be disposed on the gate insulation film 120. Referring to FIG. 3B, the first conductive layer 215c may contact the second conductive layer 213a in the first area 1A through a contact hole formed in the interlayer insulation film 130. The third conductive layer 215d may contact the second conductive layer 213b in the second area 2A through a contact hole formed in the interlayer insulation film 130.

The second conductive layer 213a in the first area 1A may be electrically connected to a TFT or the like in the display area DA. Thus, the first conductive layer 215c may be electrically connected to the TFT in the display area DA via the second conductive layer 213a. The second conductive layer 213b in the second area 2A may be electrically connected to a TFT or the like in the display area DA. Thus, the second conductive layers 213a and 213b may be located outside the display area DA and electrically connected to components inside the display area DA. The second conductive layers 213a and 213b may be located in the non-display area NDA of the display unit DU. Alternatively, the second conductive layers 213a and 213b may be located outside the display area DA and extend toward the display area DA. Thus, at least portions of the second conductive layers 213a and 213b may be located in the display area DA.

The first conductive layer 215c extending across the bending area BA may include a material with relatively high ductile characteristics. Thus, defects such as a crack in the first conductive layer 215c or a disconnection of the first conductive layer 215c may be reduced or prevented. Furthermore, the second conductive layers 213a and 213b may include a material which is less ductile than a material included in the first conductive layer 215c. The material included in the second conductive layers 213a and 213b may also exhibit similar electric/physical characteristics from those of a material included in the first conductive layer 215c. Therefore, when the second conductive layers 213a and 213b are disposed in the first area 1A or the second area 2A of the display unit DU, an efficiency of electric signal transmission of a display apparatus may be increased or an occurrence of defects during a manufacturing process may be reduced. For example, the second conductive layers 213a and 213b may include molybdenum and the first conductive layer 215c may include aluminum. Each of the first conductive layer 215c and the second conductive layers 213a and 213b may have a multi-layered structure; however, exemplary embodiments of the present invention are not limited thereto.

According to some exemplary embodiments of the present invention, the first conductive layer 215c and the third conductive layer 215d may be disposed substantially at the same time as the source electrode 215a and the drain electrode 215b are disposed. Furthermore, the second conductive layers 213a and 213b may be disposed at substantially the same time as the gate electrode 213 is disposed.

An upper protection film may be disposed on the mother substrate 100M. For example, the upper protection film may be disposed on an entire upper surface of the mother substrate 100M. The upper protection film may protect the plurality of display units DU during the manufacturing process.

The protection film 175 may be attached to the lower surface of the mother substrate 100M as described above. The mother substrate 100M may be separated into a plurality of substrates 100 of FIG. 7. The protection film 175 may protect the lower surfaces of the substrates 100 of FIG. 7. Thus, the protection film 175 may protect the lower surface of the substrate 100. Accordingly, the protection film 175 may have a hardness. When a flexibility of the protection film 175 is relatively low, an exfoliation may occur between the protection film 175 and the substrate 100 as the substrate 100 is bent. Therefore, as the protection film 175 has an opening 175OP of FIG. 5 or a groove corresponding to the bending area BA, such exfoliation may be reduced or prevented. The opening 175OP or the groove of the protection film 175 may be larger than the bending area BA. For example, the opening 175OP or the groove of the protection firm may cover the bending area BA and portions of the first area 1A and the second area 2A.

Figure 5:
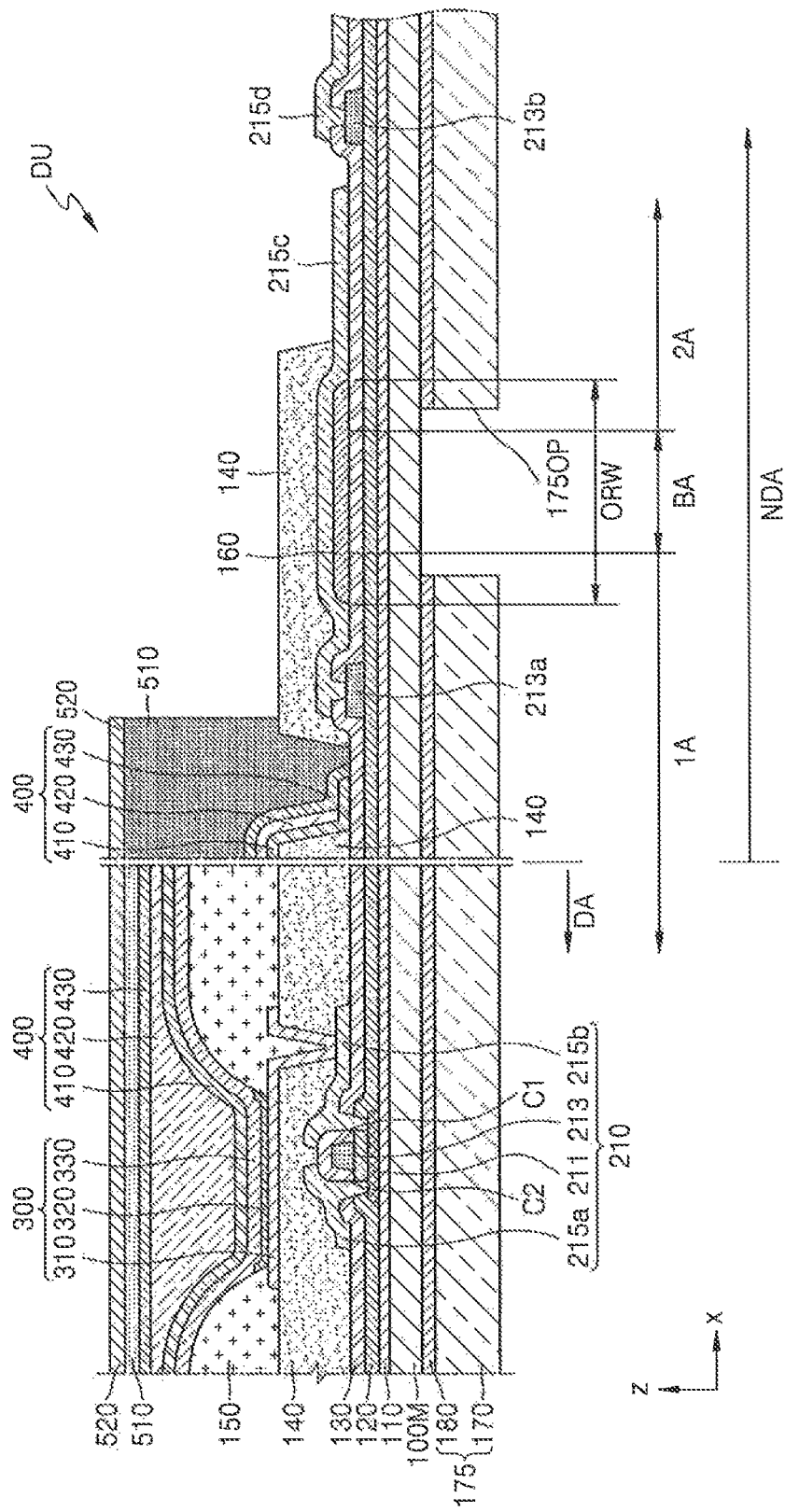

For the protection film 175 to protect the largest area of the lower surface of the substrate 100, an area of the opening 175OP of the protection film 175 may be minimized. Thus, the opening 175OP of the protection film 175 may be larger than the bending area BA. The opening 175OP of the protection film 175 may be smaller than the organic material layer 160. Referring to FIG. 5, the width of the opening 175OP may be greater than the width of the bending area BA. The width of the opening 175OP may be smaller than the width ORW of the organic material layer 160.

Figure 4:
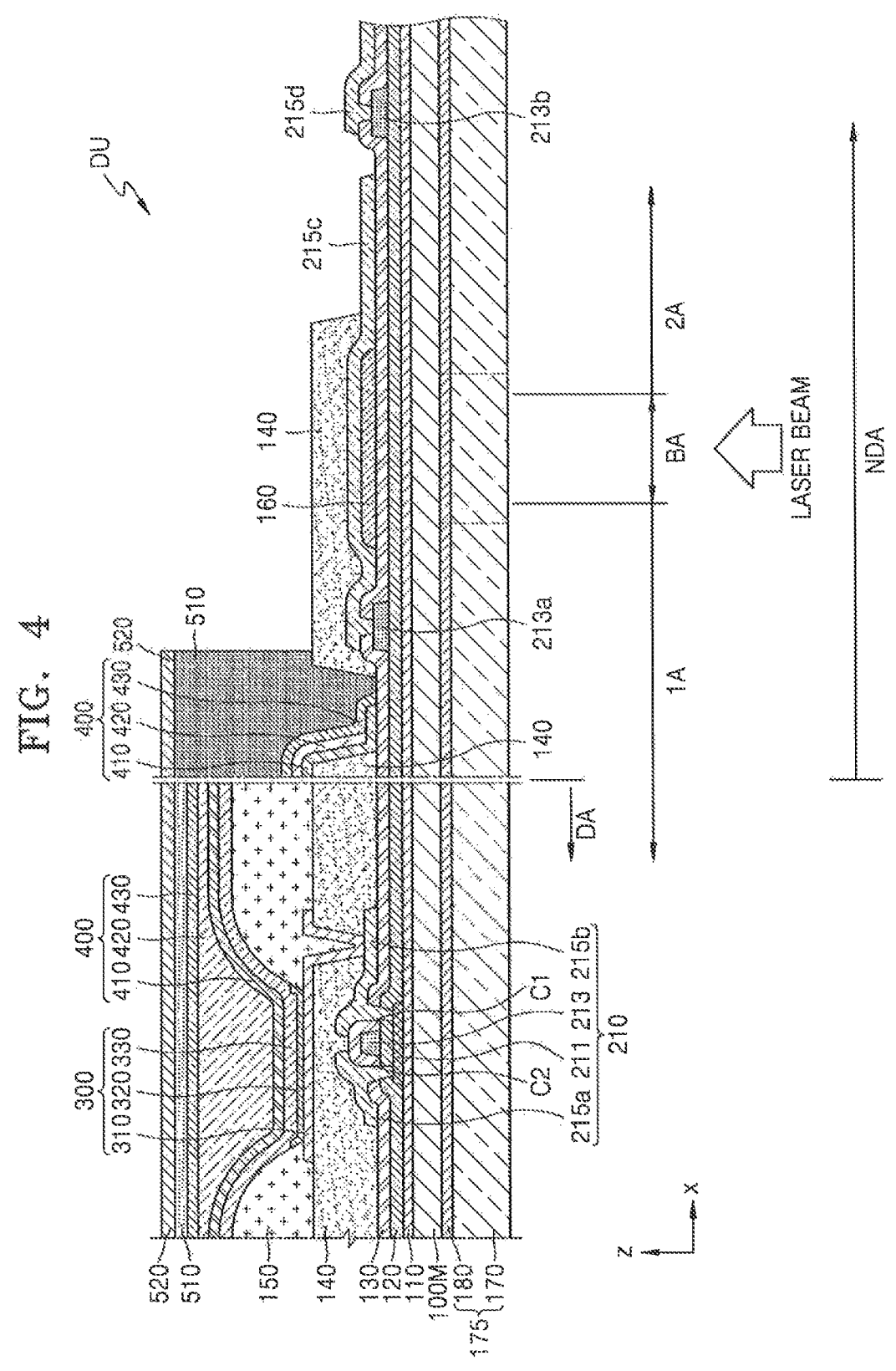

Referring to FIGS. 4 and 5, in order to form the opening 175OP or the groove of the protection film 175, at least a portion of the protection film 175 may be removed, for example, by irradiating a laser beam to a portion of the protection film 175 corresponding to the bending area BA. Thus, the opening 175OP may be formed. Although FIG. 5 illustrates that the opening 175OP is formed, various modifications may be made thereto. For example, a groove may be formed by removing at least a portion of the protection film base 170 in correspondence to the bending area BA may be formed. Alternatively, a groove in which the protection film base 170 is removed and at least a portion of the adhesive layer 180 remains may be formed.

The wavelength of the laser beam may be changed according to a material included in the protection film 175. The wavelength of the laser beam may be a wavelength that may be absorbed by the protection film 175. Thus, a portion of the protection film 175 irradiated by the laser beam may be removed by absorbing an energy of the laser beam.

According to some exemplary embodiments of the present invention, the laser beam may be an infrared (IR) laser beam. According to some exemplary embodiments of the present invention, the laser beam may be a laser beam formed by a $CO_2$ laser. The laser beam may be a laser beam having a wavelength in a range of from about 9 μm to about 10 μm. According to some exemplary embodiments of the present invention, the laser beam may have a flat-top or top-hat shaped waveform. Accordingly, a portion of the protection film 175 may be irradiated by a uniform laser beam to be removed. Thus, as described in more detail below, a risk of damaging the mother substrate 100M may be reduced.

A method for weakening an adhesiveness of the adhesive layer 180 may be performed prior to the irradiation by the laser beam. For example, the adhesive layer 180 may be irradiated by an ultraviolet (UV) ray. The adhesive layer 180 may include a pressure-sensitive adhesive material. An adhesiveness of a common pressure-sensitive adhesive material may be weakened by UV radiation.

Figure 6:
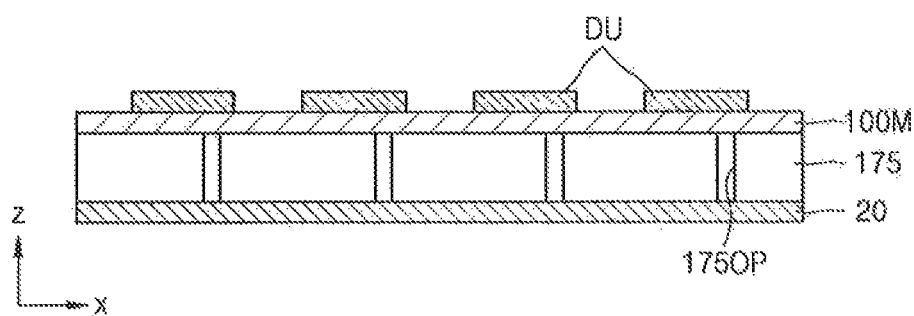

Referring to FIG. 6, when the opening 175OP is formed in the protection film 175, for example, by the laser beam, a carrier film 20 may be attached on the lower surface of the protection film 175, for example, with respect to the entire mother substrate 100M.

The carrier film 20 may reduce or prevent damage to the lower surface of the protection film 175 during a manufacturing process. The carrier film 20 may also facilitate handling a display apparatus during the manufacturing process. Since the carrier film 20 is removed during the manufacturing process, an adhesiveness between the carrier film 20 and the mother substrate 100M might not be relatively strong.

Figure 7:
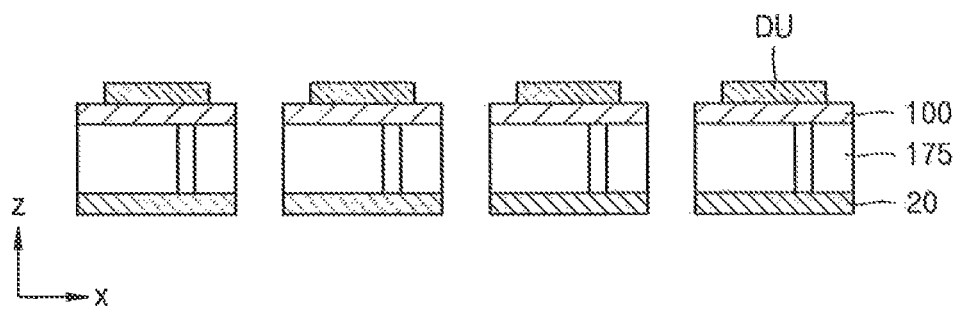

Referring to FIG. 7, the mother substrate 100M and the protection film 175 may be cut at substantially the same time. Thus, the plurality of display units DU may be separated into individual respective display units DU arranged on the substrates 100. The mother substrate 100M and the protection film 175 may be cut along a periphery of each of the plurality of display units DU. Thus, the mother substrate 100M may be divided into the plurality of substrates 100 as illustrated in FIG. 7. Therefore, the display units DU respectively disposed on the plurality of substrates 100 may be produced. The mother substrate 100M and the protection film 175 may be cut by using various methods. For example, the mother substrate 100M and the protection film 175 may be cut by a laser beam or bringing a cutting wheel into contact with the mother substrate 100M and/or the protection film 175.

When the respective display units DU are produced, a driving circuit chip or a printed circuit board may be attached to the second area 2A of each of the display units DU. The driving circuit chip and/or the printed circuit board may be connected to each of the first conductive layer 215c, the second conductive layer 213b, the third conductive layer 215d, and/or other conductive layers electrically connected to the conductive layers 215c, 213b and 215d. The driving circuit chip and/or the printed circuit board may provide a driving signal to the display area DA through the conductive layers 215c, 213b and 215d. The driving signal may refer to various signals for driving a display apparatus, such as a driving voltage, a gate signal, and a data signal.

Figure 8:
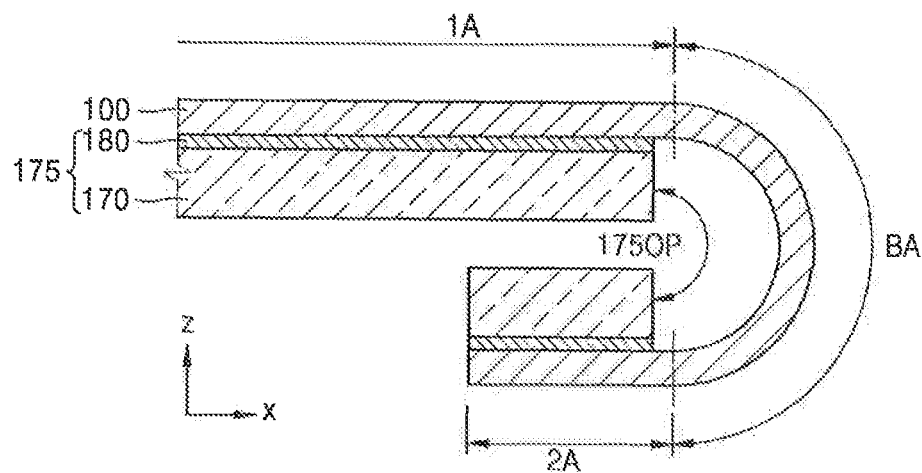

The carrier film 20 may be removed from the protection film 175, and the substrate 100 may be bent at the bending area BA. FIG. 8 is a schematic cross-sectional view illustrating a portion of the display apparatus in a bent state, and more particularly, the substrate 100 and the protection film 175 in a bent state. Referring to FIG. 8, the substrate 100 may be bent at the bending area BA. Since the protection film base 170 of the protection film 175 may protect the lower surface of the substrate 100, the protection film base 170 may have a hardness. Therefore, when a flexibility of the protection film base 170 is relatively low, an exfoliation may occur between the protection film base 170 and the substrate 100 as the substrate 100 is bent. However, in the display apparatus according to an exemplary embodiment of the present invention, the protection film 175 may have the opening 175OP correspond to the bending area BA. Thus, the exfoliation may be reduced or prevented.

Figure 9:
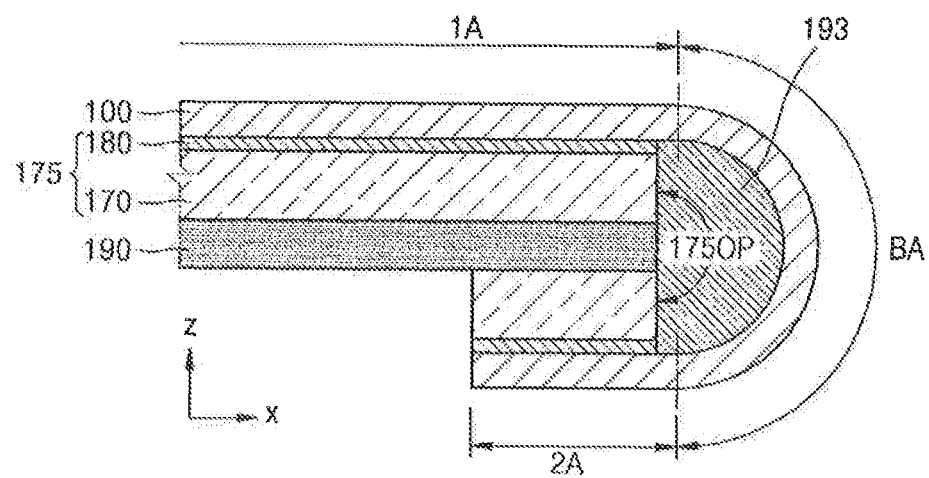

Referring to FIG. 9, when the substrate 100 is bent, a cushion layer 190 may be further disposed in an area where the first area 1A and the second area 2A face each other. Thus, the cushion layer 190 may be disposed on the protection film base 170 in the first area 1A and the second area 2A. The cushion layer 190 may be disposed where the first area 1A and the second area 2A are spaced apart from each other after the substrate 100 is bent. Thus, a display panel may be supported and shock may be absorbed. The cushion layer 190 may include an elastic material.

Furthermore, a filler 193 may be disposed at the opening 175OP of the protection film 175. The filler 193 may be disposed in the bending area BA and in a portion of the first area 1A and the second area 2A. The filler 193 may contact the substrate 100, the protection film 175 and the cushion layer 190 as illustrated in FIG. 9. The filler 193 may be disposed, for example, by injecting a liquid or paste material into the opening 175OP of the protection film 175 and curing the liquid or paste material. The filler 193 may be cured, for example, by an ultraviolet (UV) ray or by applying heat. The filler 193 may include an adhesive material. The filler 193 may reduce or prevent the substrate 100 from being deformed, for example, by a restoring force for restoring the substrate 100 to a state before the substrate 100 is bent as the filler 193 is cured, e.g., by an UV ray or heat. The cushion layer 190 and/or the filler 193 may be omitted. Alternatively, the cushion layer 190 or the filler 193 may be used.

For the display apparatus to have the protection film 175 including the opening 175OP, an opening may be formed before the protection film 175 is attached to the substrate 100, and the protection film 175 including the opening may be attached to the lower surface of the substrate 100.

The protection film 175 is patterned in advance, and alignment equipment may align the opening to a bending area when the protection film 175 is attached to the substrate 100. Furthermore, a temporary protection film may be used, for example, before the patterned protection film 175 is attached to the substrate 100. The temporary protection film may protect the provisionally patterned protection film 175 and the lower surface of the substrate 100.

According to exemplary embodiments of the present invention, since the protection film 175 may be patterned while the mother substrate 100M is formed, an alignment device and a temporary protection film as described above might not be used. Thus, process cost, time, and unit cost may be reduced.

Figure 10A:
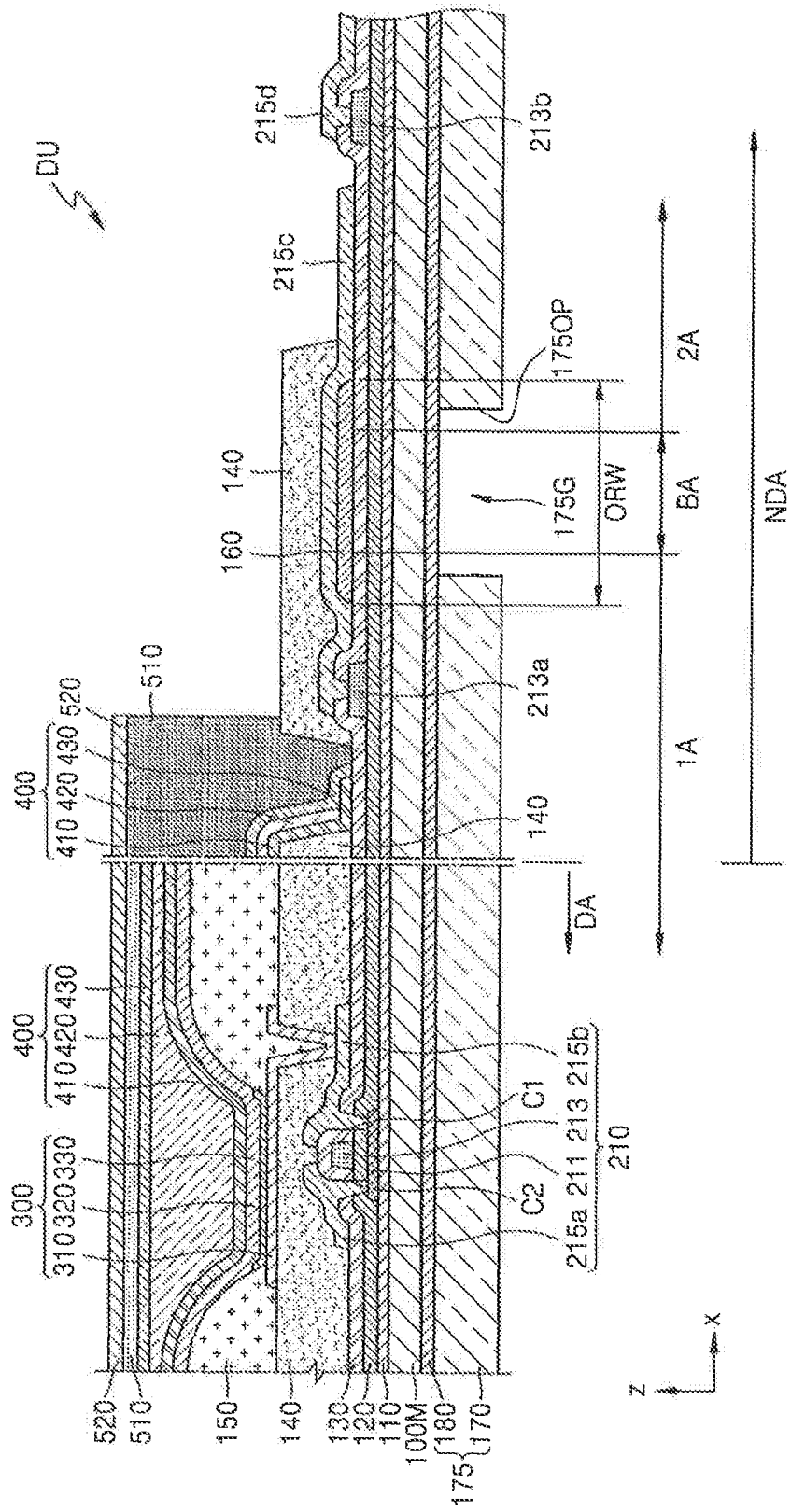
FIG. 10A is a diagram illustrating shapes of a protection film formed according to an exemplary embodiment of the present invention.
Figure 10B:
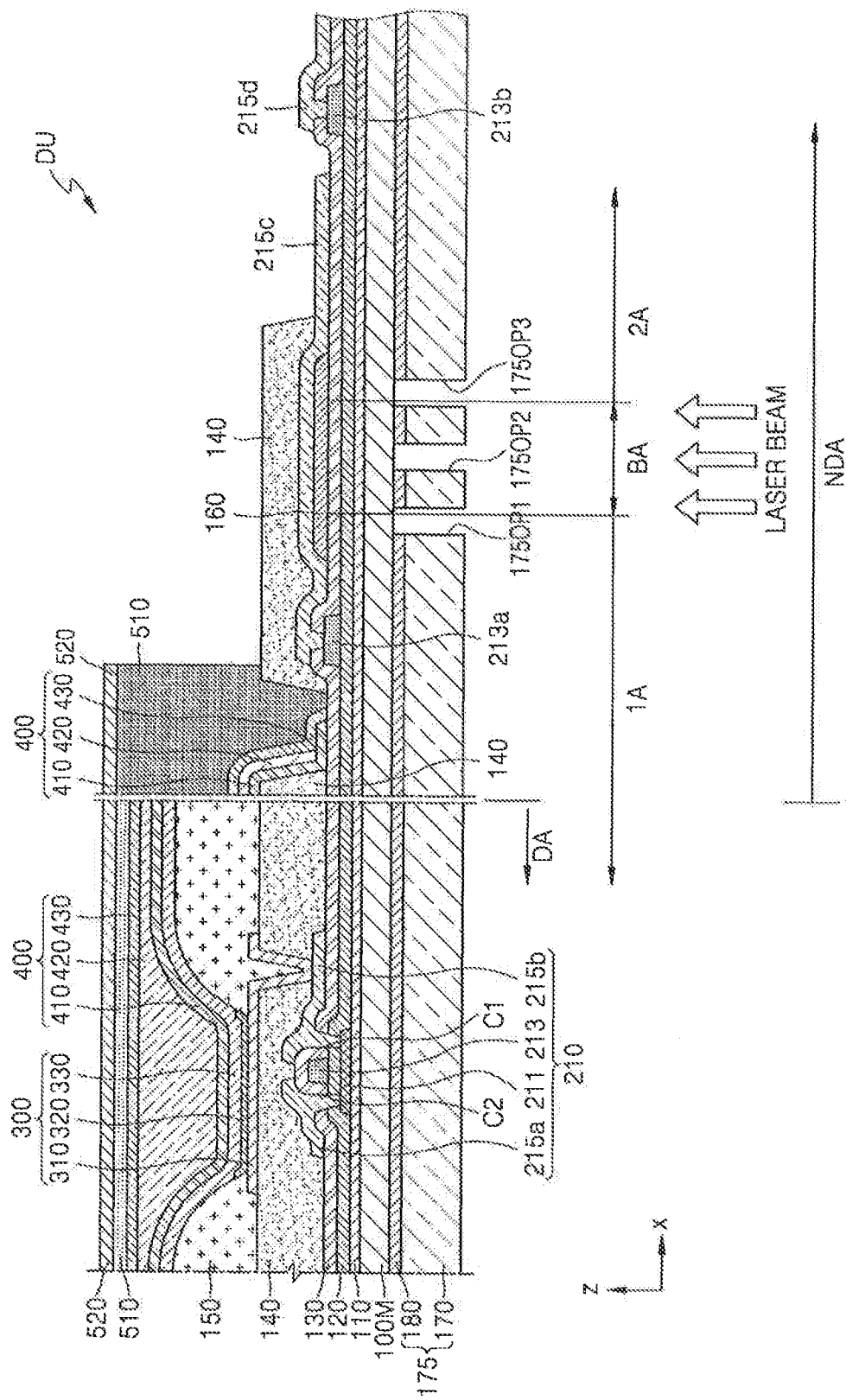
FIG. 10B is a diagram illustrating shapes of a protection film formed according to an exemplary embodiment of the present invention.

FIGS. 10A and 10B are diagrams illustrating shapes of a protection film that may be formed according to an exemplary embodiment of the present invention. In FIGS. 10A and 10B, the same reference numerals as those in FIG. 5 may refer to similar elements.

Referring to FIG. 10A, the protection film 175 may include a groove 175G. The groove 175G may refer to a groove that does not penetrate through the protection film 175. A thickness of the protection film 175 in the groove 175G may be smaller than a thickness of the other portions of the protection film 175 not located in the groove 175G.

The groove 175G may be formed in correspondence to the bending area BA. The groove 175G may be formed to be larger than the bending area BA. For example, the groove 175G may have a greater length than the bending area BA in a cross-sectional view as illustrated in FIG. 10A. The groove 175G may be disposed in the bending area BA and portions of the first area 1A and the second area 1B. Furthermore, in order for the protection film 175 to protect a largest possible area of the lower surface of the substrate 100, the area of the opening 175OP of the protection film 175 may be minimized. Thus, the opening 175OP of the protection film 175 may be larger than the bending area BA, and the opening 175OP of the protection film 175 may be smaller than the organic material layer 160. Referring to FIG. 10A, the width of the opening 175OP may be greater than a width of the bending area BA. The width of the opening 175OP may be smaller than the width ORW of the organic material layer 160.

Referring to FIG. 10A, the protection film base 170 may be removed and the adhesive layer 180 may be disposed in the groove 175G. However, exemplary embodiments of the present invention are not limited thereto, and various modifications may be made thereto. For example, the groove 175G may be formed by removing a portion of the protection film base 170. Alternatively, the groove 175G may be formed by removing a portion of the adhesive layer 180.

Referring to FIG. 10B, the protection film 175 may include a plurality of openings 175OP1, 175OP2 and 175OP3. The plurality of openings 175OP1, 175OP2 and 175OP3 may correspond to the bending area BA. The protection film 175 may also include a plurality of grooves.

The plurality of openings 175OP1, 175OP2, and 175OP3 may be formed, for example, by controlling the bandwidth of a laser beam. Thus, the plurality of openings 175OP1, 175OP2 and 175OP3 may be formed, for example, by irradiating a plurality of points of the bending area BA with a laser beam once a bandwidth of the laser beam is narrower than the bending area BA. Therefore, each of the plurality of openings 175OP1, 175OP2 and 175OP3 may be smaller than the bending area BA.

The laser beam may be formed, for example, by narrowing the bandwidth of the laser beam relative to the bending area BA and irradiating a plurality of points with a laser beam in the bending area BA. Thus, the area of each of the plurality of openings 175OP1, 175OP2 and 175OP3 may be smaller than the area of the bending area BA.

Such a structure may reduce or prevent an exfoliation of the protection film 175 from the substrate 100 as the substrate 100 is bent, similar to the protection film 175 having the opening 175OP of FIG. 5 larger than the bending area BA.

Figure 11B:
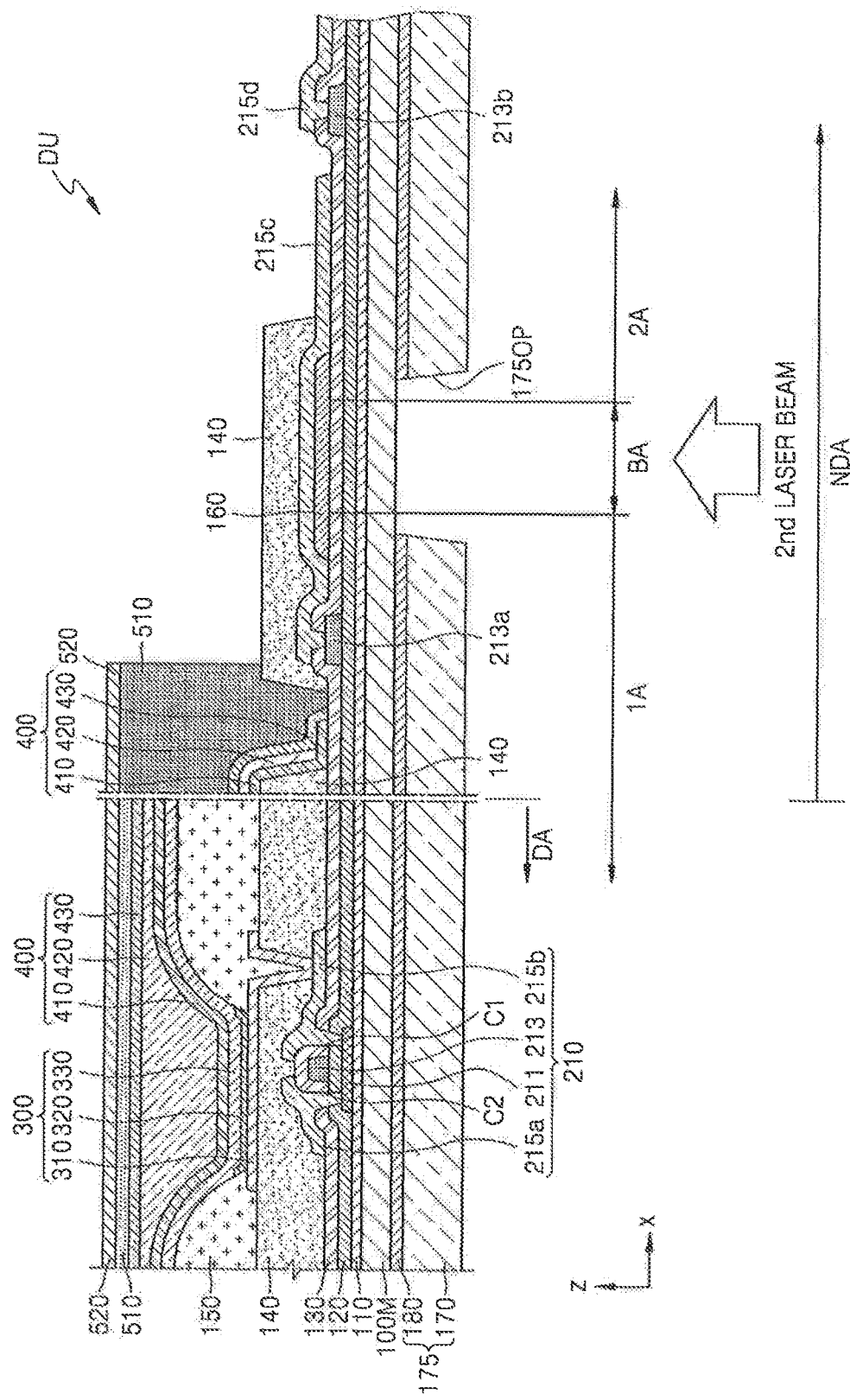

FIGS. 11A and 11B area diagrams illustrating a method for forming an opening or a groove of a protection film according to an exemplary embodiment of the present invention. According to an exemplary embodiment of the present invention, during the formation of the opening 175OP or the groove, a same area may be exposed to laser light at least twice.

Referring to FIG. 11A, an area may be irradiated with a laser beam where the opening 175OP or the groove is to be formed. At least a portion of the protection film base 170 may be removed, for example, by irradiating at least a portion of the protection film base 170 with a first laser beam. Although FIG. 11A illustrates that a portion of the protection film base 170 may be removed, various modifications may be made thereto. For example, the protection film base 170 may be completely removed in the area irradiated with the first laser beam. Alternatively, a portion of the adhesive layer 180 may be removed.

Referring to FIG. 11B, the same location to which the first laser beam is irradiated may be irradiated with a second laser beam. Thus, the opening 175OP may be formed. Although FIGS. 11A and 11B illustrate the same location may be irradiated twice with the laser beams; exemplary embodiments of the present invention are not limited thereto. For example, a same location may be irradiated more than twice with laser beams.

When the opening 175OP is irradiated by a laser beam only once, the mother substrate 100M might be damaged, for example, due to a scattering of laser processing depth. Furthermore, a difference between the width of the opening 175OP in an upward direction (e.g., a +z direction) and the width of the opening 175OP in a downward direction (e.g., a −z direction) (e.g., a difference between Kerf widths) may increase.

According to exemplary embodiments of the present invention, a same location may be irradiated with laser beams at least twice. Thus, the mother substrate 100M may be prevented from being damaged. Additionally, a difference between the width of the opening 175OP in the upward direction (e.g., the +z direction) and the width of the opening 175OP in the downward direction (e.g., −z direction) (e.g., a difference between Kerf widths) may decrease.

The intensity of the first laser beam and the intensity of the second laser beam may be the same or different from each other. According to some exemplary embodiments of the present invention, the intensity of the first laser beam may be greater than the intensity of the second laser beam. Thus, the intensity of the second laser beam for removing the protection film 175 near the mother substrate 100M may be lower than the intensity of the first laser beam. Therefore, damage to the mother substrate 100M may be minimized. For example, the intensity of the first laser beam may be within the range from about 7 W to about 10 W. The intensity of the second laser beam may be within the range from about 1 W to about 5 W. The intensity of the first laser beam and the intensity of the second laser beam may vary, for example, depending on materials and thicknesses of the protection film 175.

The first laser beam and the second laser beam may be laser beams by a same laser; however, exemplary embodiments of the present invention are not limited thereto. For example, the laser beam may be laser beams by different kinds of lasers. Furthermore, the first laser beam and the second laser beam may have a same waveform or different waveforms. For example, the first laser beam may have a Gaussian waveform and the second laser beam may have a top-hat waveform. Alternatively, both the first laser beam and the second laser beam may have either a Gaussian waveform or a top-line waveform. Various other modifications may also be made thereto.

The first laser beam and the second laser beam may be laser beams of substantially a same wavelength band.

Figure 12:
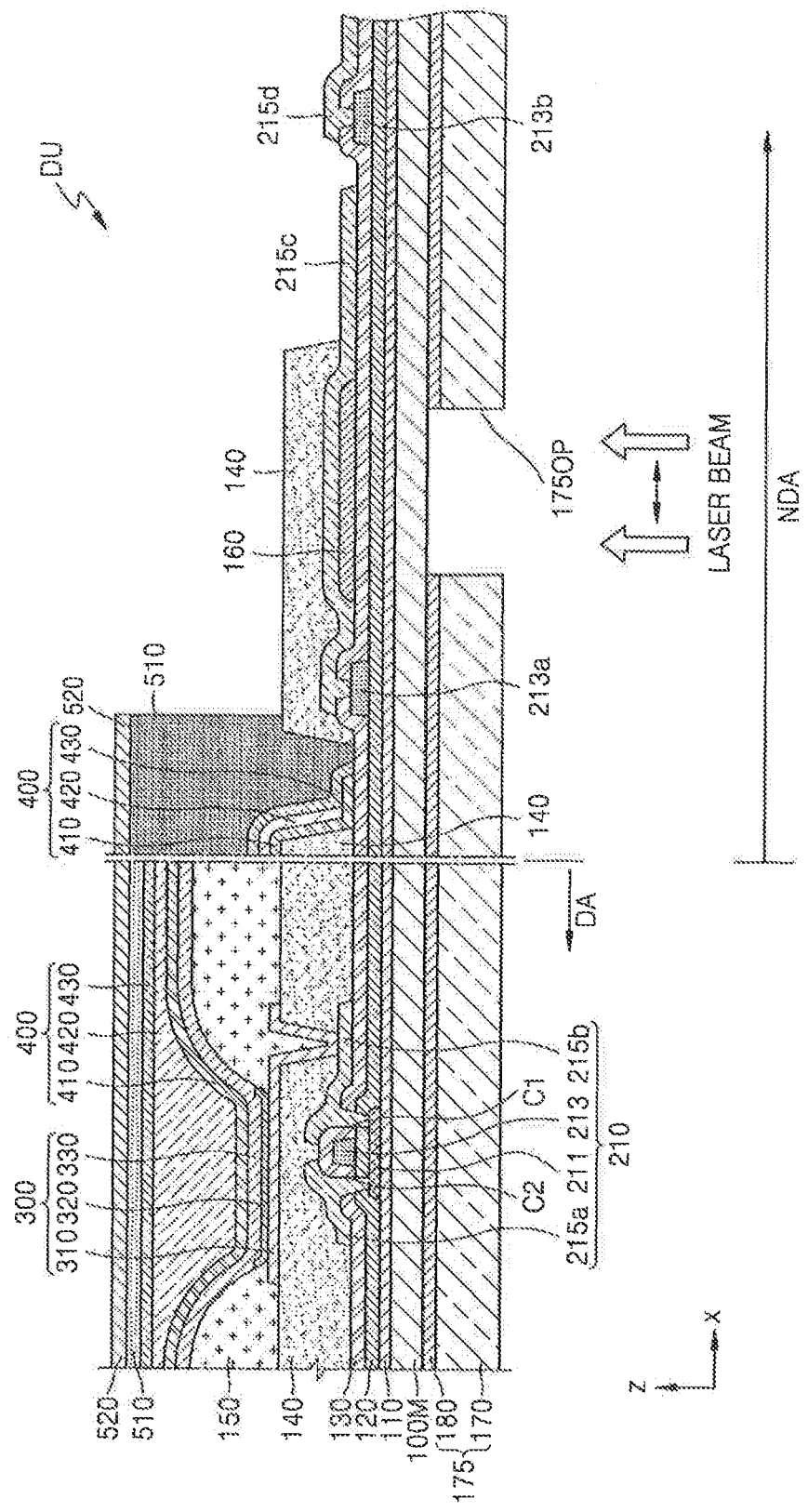
FIG. 12 is a diagram illustrating a method of forming an opening or a groove of a protection film according to an exemplary embodiment of the present invention.

FIG. 12 is a diagram illustrating a method of forming an opening or a groove of a protection film according to an exemplary embodiment of the present invention. Referring to FIG. 12, at least two locations may be irradiated by a laser beam corresponding to the opening 175OP when the bandwidth of the laser beam is smaller than the width of the opening 175OP of the protection film 175. When the bandwidth of the laser beam is within a range similar to the width of the opening 175OP, the laser beam may form the opening 175OP in one scanning. However, referring to FIG. 12, when the bandwidth of the laser beam is smaller than the width of the opening 175OP, the opening 175OP may also be formed by both ends of an area to become the opening 175OP being irradiated with laser beams.

According to an exemplary embodiment of the present invention, the opening 175OP may be formed by irradiating both ends of an area to become the opening 175OP with laser beams. A portion of the protection film 175 in the opening 175OP may be peeled in the area to become the opening 175OP.

According to an exemplary embodiment of the present invention, the area to become the opening 175OP may be sequentially removed from one end to the other end of the protection film 175, for example, by moving a location of a laser beam. Thus, the opening 175OP may be formed. The location of the laser beam may be moved, for example, by using a scanner. Accordingly, a peeling operation may be omitted.

Although a plurality of locations in the area to become the opening 175OP may be irradiated by laser beams, a method of irradiating a plurality of laser beams to a same location as described above with reference to FIGS. 11A and 11B may be applied.

Figure 13:
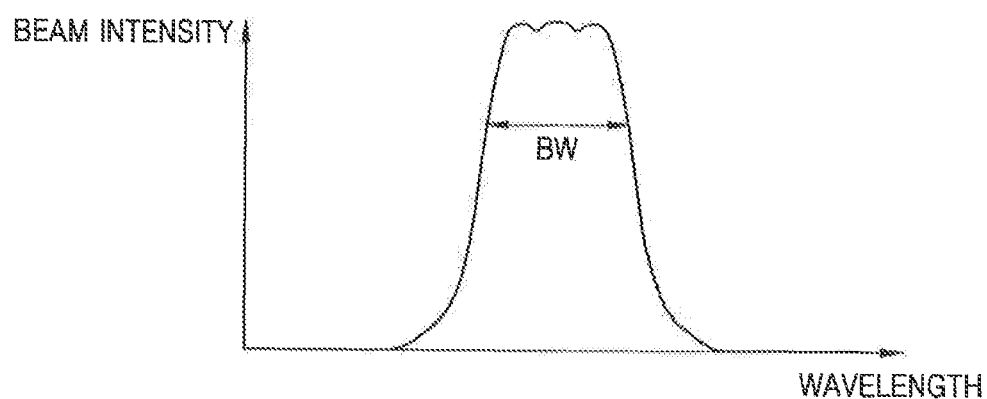
FIG. 13 is a graph illustrating a waveform of a laser beam applicable to exemplary embodiments of the present invention according to an exemplary embodiment of the present invention.

FIG. 13 is a graph illustrating a waveform of a laser beam applicable to exemplary embodiments of the present invention according to an exemplary embodiment of the present invention. According to exemplary embodiments of the present invention, the waveform of a laser beam may be top-hat shaped as illustrated in FIG. 13; however, exemplary embodiments of the present invention are not limited thereto.

A general laser beam may have a Gaussian waveform. In a Gaussian waveform, a center portion of the laser beam may exhibit the highest intensity and a relatively small bandwidth as compared to other portions of the laser beam. Thus, it may be relatively difficult to secure a processing width corresponding to a desired area. Furthermore, damage due to the center portion of the laser beam may occur.

When the waveform of a laser beam is a top-hat shape as illustrated in FIG. 13, an intensity of the laser beam at the center portion thereof may be substantially uniform. Thus, damage due to the center portion of the laser beam may be reduced or prevented. Furthermore, the bandwidth BW of a top-hat shaped laser beam as illustrated in FIG. 13 may be controlled, for example, by using an optical system. Thus, a processing width corresponding to a desired area may be obtained.

Figure 14A:
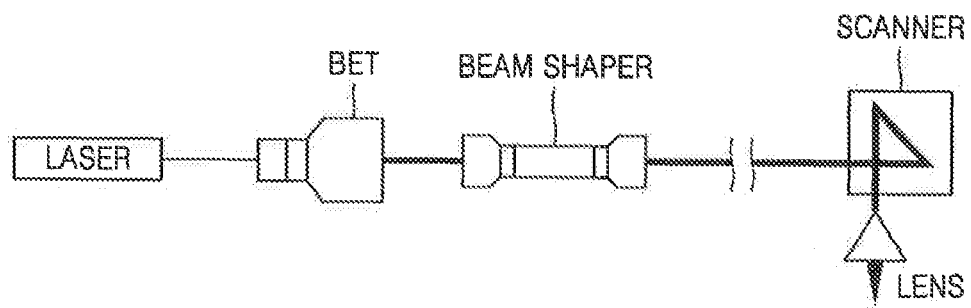
FIGS. 14A to 14C are diagrams illustrating a configuration of an optical system for forming a laser beam applicable to exemplary embodiments of the present invention according to an exemplary embodiment of the present invention.
Figure 14B:
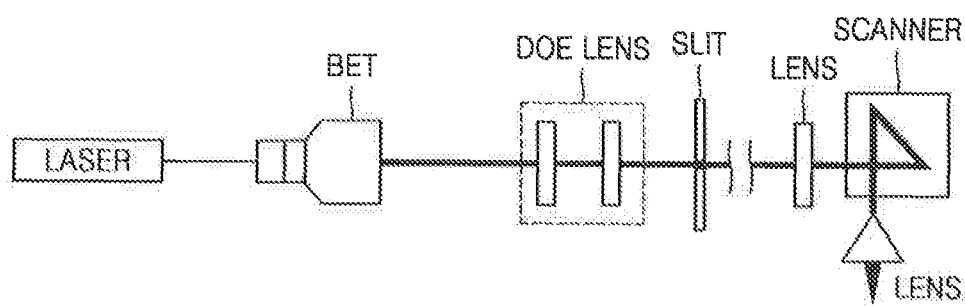
Figure 14C:
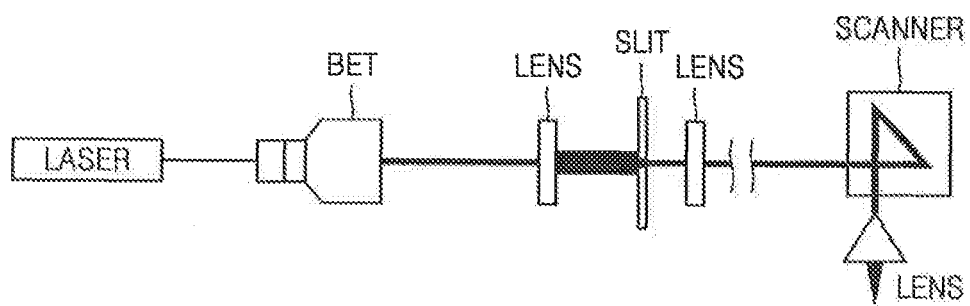

FIGS. 14A to 14C are diagrams illustrating a configuration of an optical system for forming a laser beam applicable to exemplary embodiments of the present invention according to an exemplary embodiment of the present invention. FIGS. 14A to 14C illustrate a configuration of an optical system for forming the top-hat shaped laser beam. Referring to FIG. 14A, a laser beam having a top-flat waveform may be formed, for example, by passing a laser beam having a Gaussian waveform emitted from a laser light source through each of a beam expander BET, a beam shaper, a scanner, and a lens. Referring to FIG. 14B, a laser beam having a top-flat waveform may be formed, for example, by passing a laser beam having a Gaussian waveform emitted from a laser light source through each of the beam expander BET, a diffractive optical elements (DOE) lens, a slit, a first lens, a scanner, and a second lens. Referring to FIG. 14C, a laser beam having a top-flat waveform may be formed, for example, by passing a laser beam having a Gaussian waveform emitted from a laser light source through each of the beam expander BET, a first lens, a slit, a second lens, a scanner, and a third lens. The third lens may be one of various types of lenses, such as an F-theta lens or a telecentric lens.

In FIGS. 14A to 14C, the optical system for deforming the waveform of a laser beam may include a beam shaper, a DOE lens, and a slit. By modifying the types and shapes of the beam shaper, the DOE lens, and the slit, the shape of a laser beam having a top-hat waveform, such as a bandwidth (BW), may be modified. For example, a Gaussian waveform having a bandwidth of several hundreds of μm may be transformed by the optical system into a top-hat waveform having a bandwidth of several millimeters. In FIGS. 14A to 14C, various optical systems, such as a mirror and a lens, may be additionally disposed.

Figure 15A:
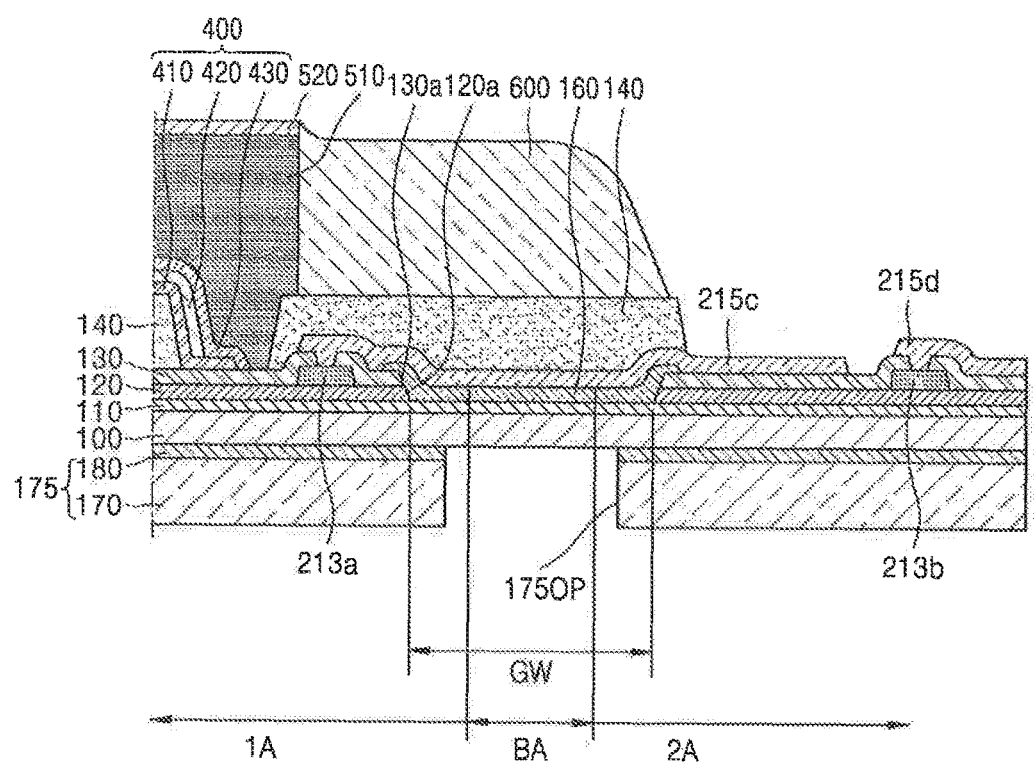
FIG. 15A is a cross-sectional view illustrating a portion of a display apparatus according to an exemplary embodiment of the present invention.

FIG. 15A is a cross-sectional view illustrating a portion of a display apparatus according to an exemplary embodiment of the present invention.

FIG. 15A is a cross-sectional view of the bending area BA. Although the inorganic insulation layer may have a substantially flat upper surface in an area overlapping an organic insulation layer, exemplary embodiments of the present invention are not limited thereto. For example, as illustrated in FIG. 15A, the inorganic insulation layer may have a groove corresponding to the bending area BA. Furthermore, in the display apparatus according to an exemplary embodiment of the present invention, a bending protection layer (BPL) 600 may be disposed on the upper surface of the substrate 100. The bending protection layer (BPL) 600 may at least partially cover the bending area BA.

Referring to FIG. 15A, the buffer layer 110 may be disposed over the first area 1A, the bending area BA, and the second area 2k The gate insulation film 120 may have an opening 120a corresponding to the bending area BA. The interlayer insulation film 130 may also have an opening 130a corresponding to the bending area BA. Therefore, an inorganic insulation layer including each of the buffer layer 110, the gate insulation film 120, and the interlayer insulation film 130 may have a groove corresponding to the bending area BA. The inorganic insulation layer may also include grooves in various forms. For example, a portion of the upper surface of the buffer layer 110 in the upward direction (e.g., the +z direction) may also be removed. Alternatively, the lower surface of the gate insulation film 120 in the downward direction (e.g., the −z direction) might not be removed. The groove may be formed at substantially the same time as forming the contact holes C1 and C2 in a patterning operation. The patterning operation for forming contact holes C1 and C2 may connect the source electrode 215a and drain electrode 215b of the TFT 210 to the semiconductor layer 211.

The grooves corresponding to the bending area BA may be refer to the grooves overlapping the bending area BA. The groove may be larger than the bending area BA. Referring to FIG. 15A, a width GW of the groove may be greater than a width of the bending area BA. An area of the groove may be defined to be smaller than one of the areas of the openings 120a and 130a of the gate insulation film 120 and the interlayer insulation film 130. The area of the groove may be defined corresponding to the area of the opening 120a of the gate insulation film 120. In the display apparatus according to an exemplary embodiment of the present invention, the organic material layer 160 may be disposed between the inorganic insulation layer and the first conductive layer 215c. The organic material layer 160 disposed between the inorganic insulation layer and the first conductive layer 215c may fill at least a portion of the groove.

Referring to FIG. 15A, although the display apparatus is not bent, the substrate 100 of the display apparatus according to the present exemplary embodiment of the present invention may be bent at the bending area BA as illustrated in FIG. 1. The display apparatus may be manufactured when the substrate 100 is substantially flat, and then the substrate 100 may bent at the bending area BA. Accordingly, the display apparatus may have a shape as illustrated in FIG. 1. A tensile stress may be applied to the first conductive layer 215c while the substrate 100 is being bent at the bending area BA. However, an inorganic insulation layer may have a groove at the bending area BA, and a portion of the first conductive layer 215c in the bending area BA may be located on the organic material layer 160 filling at least a portion of the groove of the inorganic insulation layer. Therefore, a formation of a crack at the portion of the first conductive layer 215c in the bending area BA located on the organic material layer 160 may be reduced or prevented.

A hardness of the inorganic insulation layer may be higher than a hardness of the organic material layer. Thus, a crack may be formed in the inorganic insulation layer in the bending area BA. When a crack is formed in the inorganic insulation layer, the crack may be transmitted to the first conductive layer 215c. Transmission of the crack may be blocked, for example, by using the organic material layer 160. However, by forming a groove in an inorganic insulation layer, the formation of a crack in the inorganic insulation layer may be decreased. Therefore, a concentration of tensile stress to the first conductive layer 215c may be minimized.

The BPL 600 may be disposed on the upper surface of the substrate 100, for example, to cover at least a portion of the bending area BA. The BPL 600 may overlap the bending area BA. The BPL 600 may be disposed on the first conductive layer 215c in correspondence to at least the bending area BA. When a stacked structure is bent, the stacked structure may have a stress neutral plane. When the BPL 600 is omitted, excess tensile stress may be applied to the first conductive layer 215c in the bending area BA as the substrate 100 or the like is bent, as described in more detail below. Since the location of the first conductive layer 215c might not correspond to a stress neutral plane, excess tensile stress may be applied to the first conductive layer 215c in the bending area BA as the substrate 100 or the like is bent. However, as the BPL 600 is provided and a thickness and a modulus of the BPL 600 are adjusted, the location of a stress neutral plane may be adjusted in a stacked structure including the substrate 100, the first conductive layer 215c, and the BPL 600. Thus, by placing a stress neutral plane adjacent to the first conductive layer 215c by using the BPL 600, a tensile stress applied to the first conductive layer 215c may be minimized. Thus, a bent portion of the first conductive layer 215c may be protected.

Figure 15B:
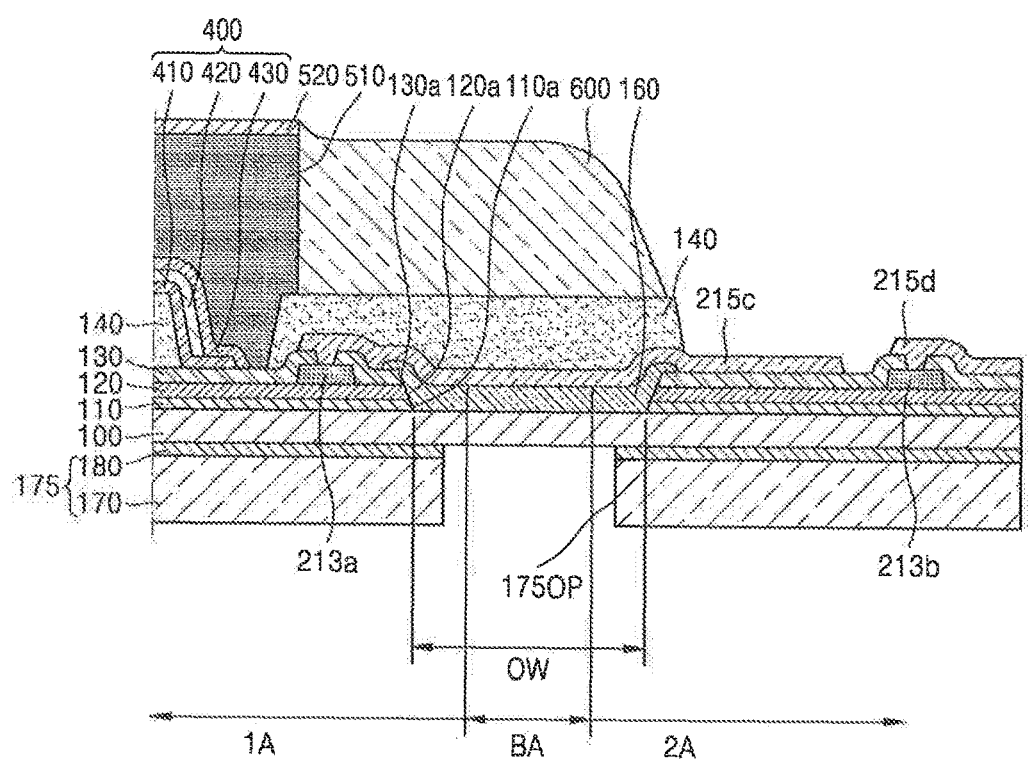
FIG. 15B is a cross-sectional view illustrating a portion of a display apparatus according to an exemplary embodiment of the present invention.

FIG. 15B is a cross-sectional view illustrating a portion of a display apparatus according to an exemplary embodiment of the present invention. Referring to FIG. 15B, the inorganic insulation layer may have an opening. The opening may correspond to the bending area BA.

Referring to FIG. 15B, the buffer layer 110, the gate insulation film 120, and the interlayer insulation film 130 may have openings 110a, 120a and 130a corresponding to the bending area BA, respectively. The opening corresponding to the bending area BA may refer to the opening overlapping the bending area BA. The opening may be larger than the area of the bending area BA. Referring to FIG. 15B, the width OW of the opening may be greater than the width of the bending area BA. An area of the opening may be defined as the area of the smallest opening from among the openings 110a, 120a, and 130a of the buffer layer 110, the gate insulation film 120, and the interlayer insulation film 130. The area of the opening may be defined corresponding to the area of the opening 110a of the buffer layer 110.

When a display apparatus as described above is manufactured, the organic material layer 160 filling at least a portion of the opening of the inorganic insulation layer may be disposed. The inorganic insulation layer may have an opening at the bending area BA. The portion of the first conductive layer 215c at the bending area BA may be located on the organic material layer 160 that fills at least a portion of the opening of the inorganic insulation layer. Since the inorganic insulation layer may include the opening at the bending area BA, a probability of formation of a crack in the inorganic insulation layer is relatively low. Since the organic material layer 160 may include an organic material, a probability of formation of a crack is relatively low. Therefore, formation of a crack in the portion of the first conductive layer 215c at the bending area BA, which is located on the organic material layer 160, may be reduced or prevented. Since the hardness of the organic material layer 160 may be lower than the hardness of the inorganic material layer, the organic material layer 160 may absorb a tensile stress caused by, for example, bending of the substrate 100. Thus, a concentration of tensile stress to the first conductive layer 215c may be minimized.

According to an exemplary embodiment of the present invention as described above, a display apparatus in which defects may be reduced during the manufacturing process while reducing manufacturing cost and process time may be provided.

It should be understood that exemplary embodiments of the present invention described herein should be considered in a descriptive sense only and not for purposes of limitation. Descriptions of features or aspects within each exemplary embodiment of the present invention should be considered as available for other similar features or aspects in other exemplary embodiments.

While one or more exemplary embodiments of the present invention have been described with reference to the figures, it will be understood by those of ordinary skill in the art that various changes in form and details may be made therein without departing from the spirit and scope of the present invention as defined by the following claims.

What is claimed is:

1. A method of manufacturing a display apparatus, the method comprising:
    forming a plurality of display units on a mother substrate, the plurality of display units each including a bending area configured to be bent about a bending axis;
    attaching a protection film to a lower surface of the mother substrate, the protection film comprising a protection film base and an adhesive layer;
    forming an opening or a groove corresponding to the bending area of each the plurality of display units by removing at least a portion of the protection film;
    cutting the mother substrate and the protection film to separate the plurality of display units from each other; and
    bending the mother substrate about the bending axis,
    wherein the removing of the at least a portion of the protection film is performed by a laser beam.

2. The method of claim 1, wherein the removing of the at least a portion of the protection film comprises removing at least a portion of the protection film base.

3. The method of claim 1, wherein the removing of the at least a portion of the protection film comprises removing at least a portion of the protection film base and at least a portion of the adhesive layer.

4. The method of claim 1, wherein the laser beam has a top-hat waveform.

5. The method of claim 4, wherein the laser beam is formed as a laser beam from a laser light source passing through an optical system comprising at least one of a beam shaper, a diffractive optical elements (DOE) lens, or a slit.

6. The method of claim 4, wherein, using the laser beam to remove the at least a portion of the adhesive layer, a first laser beam and a second laser beam are used.

7. The method of claim 6, wherein an intensity of the first laser beam is higher than an intensity of the second laser beam.

8. The method of claim 1, wherein the laser beam is generated by a $CO_2$ laser.

9. The method of claim 1, further comprising, before the removing of the at least a portion of the protection film, weakening an adhesiveness of the adhesive layer using an ultraviolet (UV) ray to a portion of the protection film in which the opening or the groove is to be formed.

10. The method of claim 1, wherein a plurality of openings or grooves are formed in the protection film corresponding to the bending area, and an area of each of the plurality of openings or grooves is smaller than an area of the bending area.

11. The method of claim 1, wherein an area of the opening or the groove of the protection film is greater than an area of the bending area.

12. The method of claim 1, wherein each of the display units is disposed on a substrate in which the bending area is disposed between a first area and a second area, and comprises:
    an inorganic insulation layer disposed on the substrate;
    a conductive layer disposed on the inorganic insulation layer and overlapping the first area, the bending area, and the second area; and
    an organic material layer disposed between the inorganic insulation layer and overlapping the bending area.

13. The method of claim 12, wherein a portion of the inorganic insulation layer overlapping the organic material layer has a substantially flat upper surface.

14. The method of claim 12, wherein the portion of the inorganic insulation layer overlapping the organic material layer has a groove or an opening, and the organic material layer fills at least a portion of the groove or the opening of the inorganic insulation layer.

15. The method of claim 1, further comprising disposing a cushion layer between the first area and the second area after each of the display units is bent.

16. A method of manufacturing a display apparatus, the method comprising:
    forming a plurality of display units on a substrate, each of the plurality of display units including a bending area;
    disposing an adhesive layer on a lower surface of the substrate;
    disposing a protection film base on a lower surface of the adhesive layer;
    forming an opening or a groove by removing at least a portion of the protection film base;
    separating the plurality of display units from each other to provide singular display units each disposed on a separate substrate;
    bending the substrate at the bending area about a bending axis;
    wherein the opening or the groove corresponds to the bending areas.

17. The method of claim 16, wherein the removing of the at least a portion of the protection film base is performed by a laser beam.

* * * * *